United States Patent
Nagai et al.

(10) Patent No.: US 6,721,037 B2
(45) Date of Patent: Apr. 13, 2004

(54) DEVICE FOR EXPOSURE OF A PERIPHERAL AREA OF A WAFER

(75) Inventors: Yoshinori Nagai, Yokohama (JP); Kazumoto Tochihara, Atsugi (JP)

(73) Assignee: Ushiodenki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/243,911

(22) Filed: Sep. 16, 2002

(65) Prior Publication Data

US 2003/0053039 A1 Mar. 20, 2003

(30) Foreign Application Priority Data

Sep. 17, 2001 (JP) .......................... 2001-281292

(51) Int. Cl.⁷ ................ G03B 27/42; G03B 27/54
(52) U.S. Cl. ............................ 355/53; 355/67
(58) Field of Search ...................... 355/53, 67, 68; 430/22, 30; 356/400, 615

(56) References Cited

U.S. PATENT DOCUMENTS

| 5,168,021 A | * | 12/1992 | Arai et al. ................. 430/22 |
| 5,229,811 A | * | 7/1993 | Hattori et al. .............. 355/50 |
| 5,289,263 A | * | 2/1994 | Kiyokawa et al. .......... 356/615 |
| 5,361,121 A | * | 11/1994 | Hattori et al. .............. 355/50 |
| 5,420,663 A | * | 5/1995 | Nakajima et al. ........... 355/50 |
| 5,811,211 A | * | 9/1998 | Tanaka et al. .............. 430/30 |
| 5,880,816 A | * | 3/1999 | Mimura et al. ............. 355/53 |
| 5,929,976 A | * | 7/1999 | Shibuya et al. ............. 355/53 |
| 5,982,474 A | * | 11/1999 | Akiyama et al. ............ 355/53 |
| 6,052,173 A | * | 4/2000 | Miura et al. ............... 355/53 |

FOREIGN PATENT DOCUMENTS

JP          03-108353          5/1991

* cited by examiner

Primary Examiner—Alan Mathews
(74) Attorney, Agent, or Firm—Nixon Peabody LLP; David S. Safran

(57) ABSTRACT

A device for exposing a peripheral area of a wafer, in which the area which is located within the wafer (and which need not be exposed) is prevented from being exposed regardless of the orientation the wafer which bears a notch in its periphery. The device includes an exposure light irradiation part, a wafer edge determination part, and a notch determination part are arranged integrally with each other. The wafer edge determination part moves such that it follows the edge of the wafer. The peripheral area of the edge of the wafer is exposed by exposure light emitted by the exposure light irradiation part. When the exposure sequence begins irradiation with exposure light is not immediately done, even if the means for wafer edge determination has determined the wafer edge. Instead, the wafer is rotated by a given amount and then exposure is begun. When the area irradiated with exposure light reaches the notch starting position, wafer edge determination is stopped until the end position of the notch is reached.

7 Claims, 14 Drawing Sheets

DEVICE FOR EXPOSURE OF A PERIPHERAL AREA OF A WAFER

BACKGROUND OF THE INVENTION

1. Field of the Invention

The invention relates to a device for exposing the outside peripheral area of a semiconductor wafer having a V-shaped notch in its periphery in order to remove a photoresist which has been applied to the surface of the semiconductor wafer.

2. Description of the Related Art

Conventionally, a device for exposure of a peripheral area of a wafer is as shown in FIG. 13(a). During exposure, an area S irradiated with exposure light is moved such that it follows the edge E of the wafer W, and the peripheral area of the wafer W, to which a photoresist R has been applied, is exposed with a given exposure width A.

In the conventional device for exposing a peripheral area, the peripheral area of the wafer W is exposed such that the edge E of the wafer W is always captured. However, in the outside peripheral area a V-shaped notch N is formed. When the wafer W is exposed, the area S irradiated with the exposure light moves in a V-shape in the area of the notch N. As a result, a phenomenon was encountered in that an area UE which is located within the interior of the wafer W and which need not be exposed is also exposed, as shown in FIG. 13(b). Therefore in the vicinity of the above described area UE there can not be an area in which a semiconductor component (a circuit pattern or the like) is formed; this is an impediment to an increase in productivity for semiconductor components. Therefore, the applicant has already proposed, in JP 2001-151037, a device for exposing the peripheral area in which the irradiated area is prevented from moving in a V-shape in the notch area of the wafer, i.e., the area located inside the V-shaped edge area of the wafer which need not be exposed is prevented from being exposed.

Exposure of the peripheral wafer area in the device described in JP 2001-151037 is illustrated in FIGS. 14(a) to 14(d).

In that device for exposing a peripheral area, the exposure light irradiation part which exposes the peripheral area of the wafer is located integrally with a means for wafer edge determination, which follows the edge E of the wafer W and moves in the direction which is essentially perpendicular to a tangent of the edge of the wafer W. The exposure light emitted from the exposure light irradiation part has an irradiation area S which moves in the same direction and by the same amount as the means for wafer edge determination. In this way the peripheral area of the wafer edge E is exposed.

Furthermore, there is a notch determination means, upstream of the wafer edge determination means, for determining the notch of the wafer. In the following, the term "upstream" is defined as the peripheral area of the wafer which moves toward the means for wafer edge determination when the wafer is turned, and the term "downstream" is defined as the peripheral wafer area which moves away from the means for wafer edge determination.

The notch determination means described above is arranged integrally with the means for wafer edge determination and the exposure light irradiation part, and is synchronized with the means for wafer edge determination and is moved in the direction essentially perpendicular to the tangent of the edge of the wafer W.

A condition is described below in which the peripheral area of a wafer has an outside peripheral area provided with a notch and to which a photoresist has been applied. The photoresist is exposed by the above described device to expose a peripheral area by determining the edge of this wafer. In FIGS. 14(a) to 14(d) the notch area of the wafer is shown enlarged.

The wafer W which has been placed on the treatment stage is turned clockwise, as shown in FIGS. 14(a) to 14(d). The means for wafer edge determination determines the edge E of the wafer W at the position. The area S irradiated with the exposure light from the exposure light irradiation part is located on the surface of the wafer W essentially at the same location as the above described position. The notch determination means upstream of the wafer W, i.e., at position ◉, determines the edge E of the wafer W.

The four situations encountered during exposure will now be described.

(1) When the edge area except for the notch of the wafer is determined by the notch determination means, as is shown in FIG. 14(a):

The means for wafer edge determination follows the wafer edge and moves in the direction essentially perpendicular to the tangent of the edge of the wafer W. The exposure light irradiation part located integrally with it moves together with the wafer edge determination means. The area S irradiated with the exposure light from the exposure light irradiation part therefore follows the wafer edge E and moves. Thus, as shown in FIG. 14(a), the peripheral wafer area is exposed.

(2) When the notch determination means has reached the start of the notch of the wafer, as shown in FIG. 14(b):

When the wafer W turns clockwise and the start Ns of the notch N of the wafer W reaches the determination position ◉ of the notch determination means, the notch determination means outputs an ON signal. In this way, a controller (not shown) computes the time T1 at which the area S irradiated with the exposure light reaches the start Ns of the notch N based on the rotational speed of the wafer W and the distance between the determination position ◉ of the notch determination means and the position of the wafer edge determination means (in this example 5 mm).

(3) When the time T1 has lapsed after the notch determination means has reached the start Ns of the notch, as was shown in FIG. 14(c):

When time T1 elapses after the notch determination means has reached the start Ns of the notch N, the area S irradiated with the exposure light reaches the start Ns of the notch N. In this way, the controller stops the operation in which the wafer edge determination means follows the edge E of the wafer W. Therefore, the wafer edge determination means and the area S irradiated with the exposure light do not follow the notch N, but move along the tangent of the edge E of the area directly in front of the notch N of the wafer W.

The above described controller computes the time T2 at which operation of the wafer edge determination means follows the edge E of the wafer W is restarted after stopping. For example, based on the gap dimensions, the notch N is determined and based on the rotational speed of the wafer W, the time T2 at which the area S travels from the start Ns of the notch N to the end Ne of the notch N is determined.

(4) When time T2 has elapsed, as shown in FIG. 14(d):

When time T2 elapses after the area S has reached the start of the notch Ns, the area S reaches the end Ne of the notch N. The controller then restarts operation in which the wafer edge determination means follows the edge E of the wafer W. In this way the means for wafer edge determination moves such that it follows the wafer edge E. As was shown above using FIG. 14(a), the area S irradiated with the exposure light which has been emitted from the exposure light irradiation part moves in such a way that it follows the wafer edge E. Thus, as shown in FIG. 14(d), the peripheral wafer area is exposed.

By the above described process, the tracking operation of the means for wafer edge determination is stopped after a given time has lapsed, i.e., after it has received the signal which indicates the notch start Ns. The tracking operation of the wafer edge determination means is restarted, after a further given time T2 has elapsed, i.e. when the area S reaches the end Ne of the notch N. By this method the irradiation area in the notch area of the wafer is prevented from following the notch and from moving in a V-shape, and the area located inside the wafer, which need not be exposed, is prevented from being exposed.

In the above described device for exposure of a peripheral area the wafer, the edge determination means moves in the radial direction of the wafer when exposure of the peripheral area starts. When the wafer edge determination means determines the wafer edge, the means for wafer edge determination stops motion in the radial direction of the wafer. At the position at which the edge could be determined, irradiation with the exposure light is begun and thus exposure of the peripheral area is started.

However, if normally a notched wafer W is placed on the rotary treatment stage of the device for exposing the peripheral area, the position of the notch N (i.e. in which direction the notch is to be placed) is not fixed.

When exposure starts, the notch determination means therefore cannot determine, before the means for wafer edge determination, the starting position of the notch when the means for wafer edge determination or the notch determination means is located in the vicinity of the notch N in the position at which the wafer edge was initially determined, as is described below in (a) to (c):

(a) when the position of the means for wafer edge determination and the position of the notch agree with one another;

(b) when the notch is between the notch determination means and the means for wafer edge determination;

(c) when the position of the notch determination means and the position of the notch agree with one another.

Therefore, stop control of the tracking operation of the means for wafer edge determination cannot be carried out. That is, the above described peripheral area exposure in which there is no conformity with the notch cannot be carried out, i.e. in which the notch is ignored (also called "notch disregard" below).

In the above described situations, the position at which the means for wafer edge determination determines the wafer edge, and the position which is irradiated with the exposure light which exposes the peripheral area of the wafer agree with one another, as was described above.

Also as was described above, in the conventional peripheral area exposure the phenomenon occurs, in the above described cases (a) to (c), where peripheral area exposure in which the notch is ignored cannot be done, and the area located within the wafer (which does not need to be exposed) is also exposed.

SUMMARY OF THE INVENTION

The invention strives to eliminate the above described disadvantages. The object of the invention is to provide a device for exposing the peripheral area when in the above described cases (a) to (c), that is, those situations in which the means for wafer edge determination or the notch determination means are located in the vicinity of the notch, peripheral area exposure can be done in which the notch is ignored and in which it is possible to prevent the area within the wafer from being exposed.

The object is achieved by the invention as follows:

After determining the wafer edge by the means for wafer edge determination, the exposure light is not emitted immediately, but the wafer is turned by a given amount, and afterwards exposure is started. If, during the above described rotation, the output signal of the above described notch determination means has changed, based on the timing of the initial change of the notch determination means, the starting position of the notch can be detected. Therefore, at the exposure start position which has been established beforehand according to the change state of this output signal, irradiation with wafer exposure light is started and the above described control is effected in which the notch is disregarded when the irradiation area has reached the notch starting position.

The above described given amount of rotation must be at least larger than the distance (D1) which corresponds to the distance between the means for wafer edge determination and the notch determination means.

The above described measure makes it possible, in the states (a) to (c) above, to also carry out peripheral exposure in the manner to be described below, in which the notch is ignored. Furthermore, the above described measures prevent the area which is located within the wafer (and which need not be exposed) from being exposed.

(1) When the position of the means for wafer edge determination and the position of the notch agree with one another, as was described in (a).

By turning the wafer by the means for wafer edge determination by a given amount of (D1+α) (here "α" denotes the deviation which is determined to balance the mounting and control errors by experimentation or the like) from the position at which the wafer edge has been determined, the means for wafer edge determination diverges from the notch. From there exposure is begun. After starting exposure, when the wafer has been turned essentially once, the notch is determined by the notch determination means. Therefore motion of the exposure light irradiation part is stopped and exposure is done such that it does not follow the notch area, as was described above.

(2) When the notch is located between the notch determination means and the means for wafer edge determination, as was described above in (b).

By rotation of the wafer by a given amount of (D1+α) the notch passes through the position of the means for wafer edge determination, as in case (1). The means for wafer edge determination reaches a position away from the notch. From there exposure is begun. After starting exposure, when the wafer has been turned essentially once, the notch is determined by the notch determination means. Therefore motion of the exposure light irradiation part is stopped and exposure is carried out such that it does not follow the notch area, as was described above.

(3) When the position of the notch determination means and the position of the notch agree with one another, as was described in (c).

In this case, at the instant at which the means for wafer edge determination has determined the wafer edge, the notch determination means outputs a notch determination signal. But since it is unknown where the starting position of the notch is located, the timing for stopping motion of the exposure light irradiation part is unclear.

Therefore, as was described above, the wafer is turned by the given amount (D1+α) and afterwards it is turned further at least by an amount (D2+α) which corresponds to the width of the notch. In this way the notch passes through the position of the means for wafer edge determination and the means for wafer edge determination reaches a position outside of the notch. Therefore, proceeding from this position exposure begins. After starting exposure, when the wafer has turned essentially once, the notch is determined by the notch determination means. Therefore motion of the exposure light irradiation part is stopped and notch disregard exposure is carried out, as was described above.

In this case, during rotation of the wafer by the above described amount of (D1+α), the output of the notch determination means is shifted into the OFF state. Based on the timing, the notch width and the like, the starting position of the notch can be detected. Therefore, instead of the above described rotation of the wafer, turned at least by the amount of (D2+α), which corresponds to the width of the notch, the above described notch disregard control can begin when the area irradiated with the exposure light is reached for the notch start position which has been determined in the above described manner.

The above described states (a) to (c) are conditions in the determination of the wafer edge. But there are also situations in which the above described states (a) to (c) are obtained, at the instant of rotation of the wafer by the given amount. In this case however, the output state of the notch determination means changes by a given amount during rotation of the wafer. Based on this output change, the relative position of the area irradiated with the exposure light to the notch can be determined. Therefore, by fixing the instant of the start of exposure based on the position of the area irradiated with the exposure light relative to the notch, which position has been determined in the above described manner, and by the above described notch disregard control the disadvantage that the area which is located within the wafer (and which need not be exposed) is not exposed.

Specifically, when starting exposure the procedure is as follows:

(A) If during rotation of the wafer by the given amount of (D1+α) after determining the wafer edge the output of the notch determination means does not change.

In this case there are the following cases:

(1) Case in which the notch area is not involved at all.

(2) Case in which the notch is between the notch determination means and the means for wafer edge determination when the wafer edge is being determined.

(3) Case in which the position of the means for wafer edge determination and the position of the notch agree with one another when the wafer edge is determined.

In the above described case (1) the notch area is not involved at all. Therefore no problem arises even if directly after rotation of the wafer by the above described amount of (D1+α) exposure is started.

The above described cases (2) and (3) relate to the cases of the above described states (a) and (b). Therefore no problem arises even if after rotation of the wafer by the above described amount of (D1+α) exposure is started.

(B) If during rotation of the wafer by the give amount of (D1+α) after determination of the wafer edge the output of the notch determination means is changed.

In this case, based on the output of the notch determination means, the relative distance between the irradiation area and the notch starting position can be determined. It is therefore possible to carry out the above described notch disregard control even if exposure starts immediately when the output is generated by the notch determination means. Thus the disadvantage of exposing the area located within the wafer can be avoided.

In practice, considering the simplification of the control sequence, the instant for the exposure start can be set in the manner described below.

(1) As in the above described case A, after rotation of the wafer by the given amount of (D1+α), exposure is begun. If during the above described rotation, the notch determination means produces an output, the relative distance between the irradiation area and the notch starting position is determined based on this output. When the irradiation area reaches the notch starting position, the above described notch disregard control is carried out.

In this case, besides the above described case (3) (case in which the position of the notch determination means and the position of the notch agree with one another) after rotation of the wafer by the given amount of (D1+α), exposure is begun. The control sequence is therefore relatively simple.

(2) As in the above described case A, after rotation of the wafer by the given amount of (D1+α) the wafer is additionally rotated by the above described amount of (D2+α) which corresponds to the width of the notch, and afterwards exposure is begun. When the irradiation area reaches the notch starting position, the above described notch disregard control is carried out.

In this case exposure is begun after the wafer has been rotated in all cases by the given amount of (D1+α) and by the above described amount of (D2+α) which corresponds to the width of the notch. The control sequence is therefore especially simple. The instant at which exposure is begun is however delayed, by which the throughput is reduced.

(3) When the output signal of the notch determination means changes, exposure is begun immediately. This is the case in which exposure begins immediately when an output is generated by the above described notch determination means. Compared to the above described cases (1) and (2), an earlier instant for the start of exposure can be taken, increasing the throughput. The control sequence becomes more complex, however, when compared to the above described cases (1) and (2).

The invention is further described below using several embodiments shown in the drawings.

DETAILED DESCRIPTION OF THE INVENTION

Figure 1:
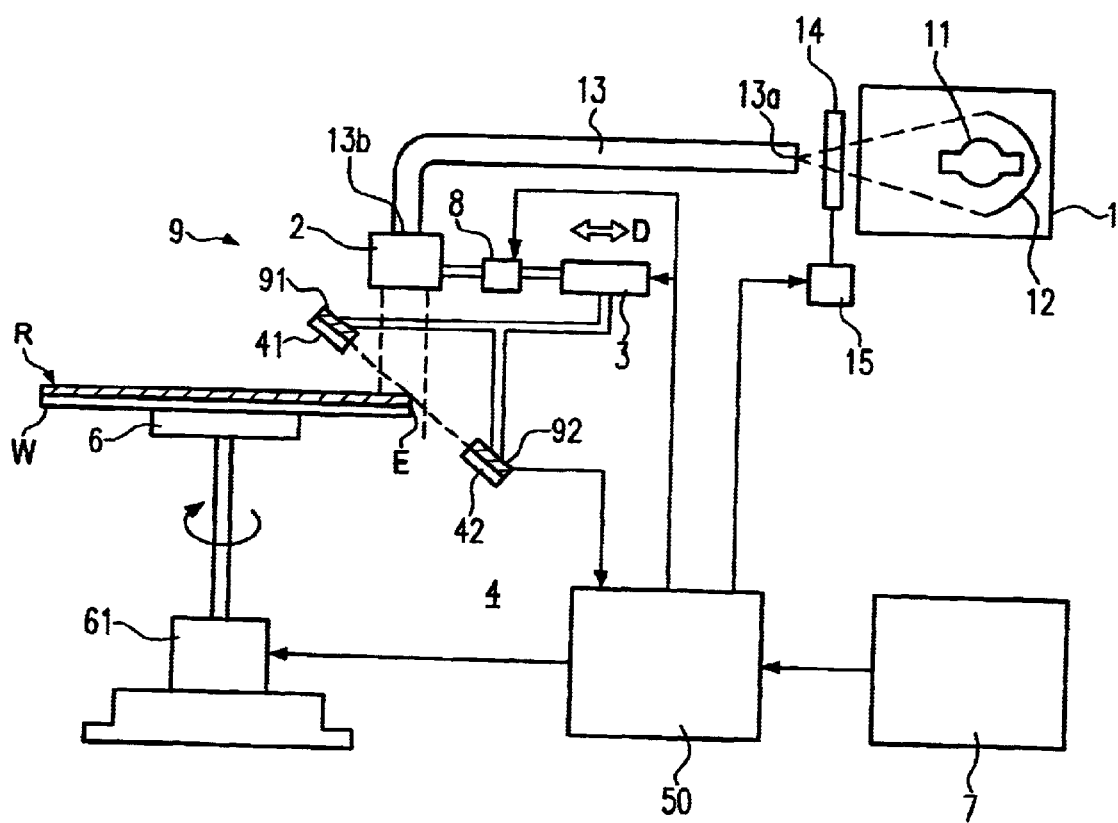
FIG. 1 shows a schematic of the arrangement of the device for exposure of the peripheral area as the prerequisite of the invention.
Figure 2:
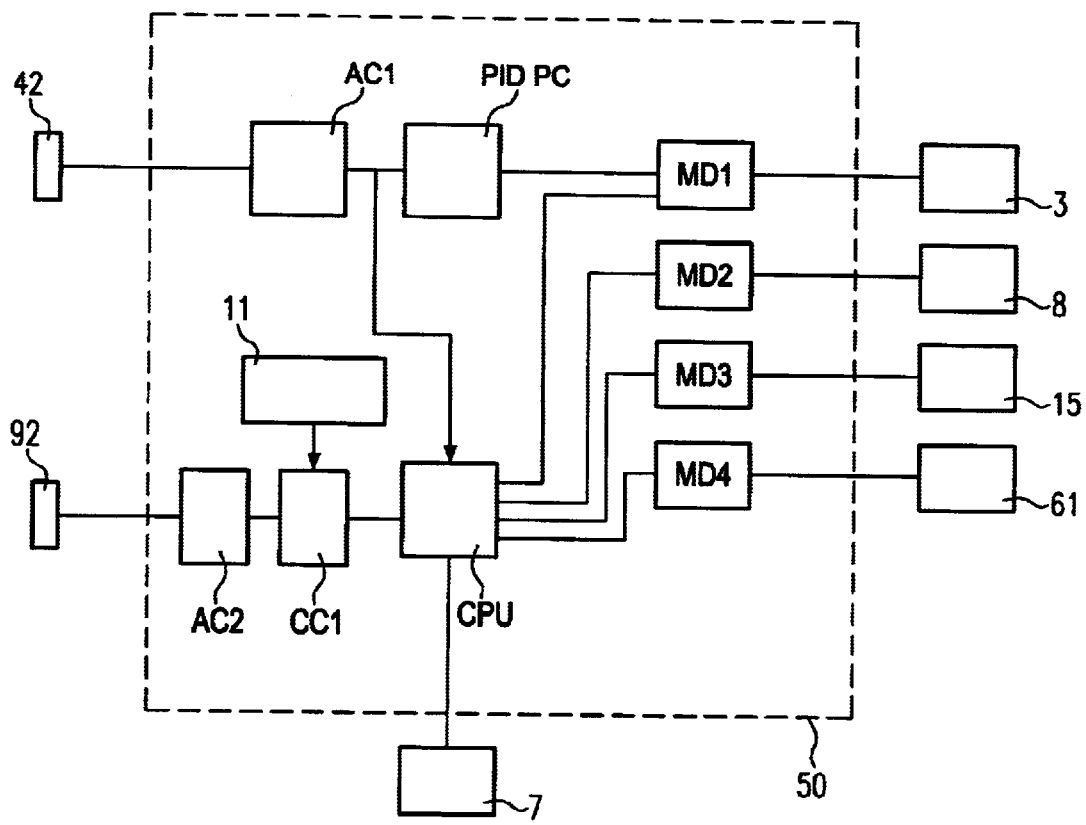
FIG. 2 shows a schematic of the arrangement of the controller of the device as claimed in the invention for exposure of the peripheral area.

FIG. 1 shows the arrangement of a device for exposure of the peripheral area as the prerequisite of the invention. FIG. 2 shows the arrangement of the controller of the device of the invention for exposure of the peripheral area.

In FIGS. 1 and 2, element 1 is a light source part, in which there is a lamp 11 which emits light which contains UV radiation, for example a super-high pressure mercury lamp with a nominal wattage of 250 W. The radiant light from this lamp 11 is focused using a focusing mirror 12 on an incidence end face 13a of optical fibers 13. Between the lamp 11 and the incidence end face 13a of optical fibers 13 there is a shutter 14 which is opened or closed by the drive of a shutter drive device 15. When a shutter OPEN signal is sent from the operation part CPU within the controller 50 to the part MD3 for driving the shutter drive device, the part MD3 for driving the shutter drive device drives the shutter drive device 15 and the shutter 14 is opened. In this way the light focused by the focusing mirror 12 is incident on the incidence end face 13a of the optical fibers 13 and is emitted as exposure light with a given irradiation area S from an exposure light irradiation part 2 which is installed on the exit end face 13b of these optical fibers 13.

The exposure light irradiation part 2 is arranged integrally with a means 4 for wafer edge determination and is movably held by a device 3 for moving the means for edge determination in the direction which is essentially perpendicular to the tangent of the edge E of the wafer W, i.e. essentially in the direction to the wafer middle o (in the two arrow direction D in FIG. 1). The exposure light emitted from the exposure light irradiation part 2 with the given irradiation area S moves therefore in the same direction and by the same amount as the means 4 for wafer edge determination. Furthermore, a notch determination means 9 which carries out only determination of the notch N is arranged integrally with the above described means 4 for wafer edge determination.

Furthermore, reference number 6 labels a treatment stage on which the wafer W is placed, which has an outside peripheral area provided with a notch N, and to which a photoresist R has been applied. The wafer W is attached by an attachment means (not shown), for example by vacuum suction. The treatment stage 6 is furthermore rotationally held by a treatment stage rotation device 61.

When a stage rotation start signal is sent from the operation part CPU within the controller 50 to the part MD4 for driving the treatment stage rotation device, the part MD4 for driving the treatment stage rotation device drives the treatment stage rotation device 61, and based on the data which were input into the input part 7, such as the speed of rotation, the angle of rotation, the frequency of rotation and the like, starts rotation of the treatment stage 6.

Figure 3:
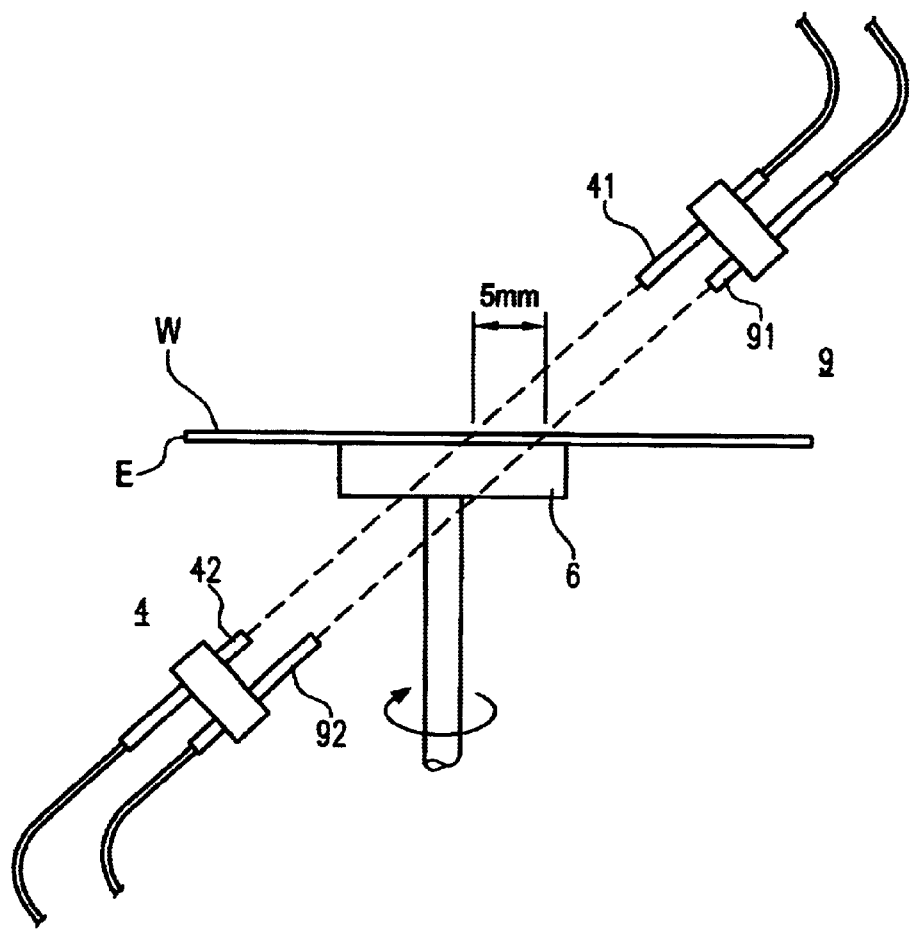
FIG. 3 shows a schematic of one example of the arrangement of the means for wafer edge determination and of the notch determination means.

FIG. 3 shows one example of the arrangement of the above described means for wafer edge determination and of the notch determination means. The means 4 for wafer edge determination consists of the projection part 41 which projects sensor light and of the light receiving part 42 which receives this sensor light and outputs to the controller 50 an analog signal which becomes larger or smaller depending on the amount of sensor light projected by the projection part 41 onto the light receiving part 42. The controller 50 which is shown in FIG. 2 amplifies the above described analog signal from the light receiving part 42 by means of an amplifier AC1 for example in such a way that a signal which is obtained in the case of complete shielding by the wafer W which has been placed on the treatment stage 6 is amplified to −5 V and that a signal which is obtained in the case of no shielding at all is amplified to +5 V.

The above described voltage signal which was amplified in the above described amplifier AC1 is computed in a PID circuit PC and a control signal which is used to make the above described voltage signal into a constant voltage is output to the part MD1 for driving the device for moving the means for edge determination.

The part MD1 for driving the device for moving the means for edge determination within the controller 50 drives the device 3 for moving the means for edge determination such that the means 4 for wafer edge determination is positioned at a site at which the signal from the light receiving part 42 is for example 0 V, i.e., at which the sensor light from the projection part 41 is half-shielded and at which the other half is received by the light receiving part 42. The means 4 for wafer edge determination therefore always moves to the above described position, i.e. to the position of the edge E of the wafer W.

The notch determination means 9 consists, like the means 4 for wafer edge determination, of a projection part 91 which projects sensor light, and of a light receiving part 92 which receives this sensor light, and is at the location at which when the wafer W is turned the notch N of the wafer W can be determined earlier than by the means 4 for wafer edge determination, and at which the distance between the means 4 for wafer edge determination and the notch determination means 9 is greater than the width of the notch N (roughly 3.5 mm in the case of a wafer with a diameter of 300 mm and roughly 3 mm in the case of a wafer with a diameter of 200 mm), for example 5 mm upstream of the means 4 for wafer edge determination, as is shown in FIG. 3. Since here the notch determination means 9 is arranged integrally with the means 4 for wafer edge determination, the sensor light can be projected onto the wafer edge in the vicinity.

In the controller 50 of the device for exposing a peripheral area, which controller is shown in FIG. 2, there are an amplifier AC2 and a comparison circuit CC1 which are used to process signals from the light receiving part 92 of the above described notch determination means 9. The comparison circuit CC1 compares an input signal value to the preset adjustment value and outputs an ON signal to the operation part CPU in order to show that the notch N has been determined when the input signal value is greater than the adjustment value, and outputs an OFF signal to it when the input signal value is less than the adjustment value.

As in the analog signal from the light receiving part 42 of the means 4 for wafer edge determination, an analog signal from the light receiving part 92 of the notch determination means 9 is amplified by the amplifier AC2 and input into the comparison circuit CC1.

The comparison circuit CC1 compares the above described input signal value to the preset adjustment value I1 and outputs an ON signal to the operation part CPU when the input signal value is greater than the adjustment value I1.

When the ON signal is input, the operation part CPU carries out the computation described below, outputs to the part MD1 for driving the device for moving the means for edge determination after a given time an operation stop signal, stops operation of the device 3 for moving the means for edge determination, after a given time has elapsed outputs an operation restart signal and restarts operation of the device 3 for moving the means for edge determination.

The output of the above described amplifier AC1 is input to the operation part CPU. The operation part CPU, when exposure starts, as is described below, rotates the rotary stage by the above described given amount of (D1+α) when the wafer edge is determined by the means 4 for wafer edge determination. If during the above described rotation by the given amount the output signal of the notch determination means 9 does not change, exposure is begun after completion of rotation. If during the above described rotation by the given amount the output of the notch determination means 9 does change, as described above, exposure is begun with timing which corresponds to the change of state of the output of the notch determination means.

The sequence of exposure of the peripheral area of the wafer by the above described device for exposing a peripheral area is described below.

(1) First, the wafer W which has an outside peripheral area provided with a notch N and to which a photoresist R has been applied is transported by a wafer transport and placement means (not shown) and placed on the treatment stage 6 in the state in which the middle of the wafer W and the center of rotation of the treatment stage 6 essentially agree with one another.

(2) If an exposure width adjustment start signal is sent from the operation part CPU within the controller 50 to the part MD2 for driving the exposure width adjustment device, the part MD2 for driving the exposure width adjustment device, based on data of the exposure width A (the width to be exposed proceeding from the edge E of the wafer W) which was input beforehand into the input part 7, drives the exposure width adjustment device 8 and moves the area S irradiated with the exposure light to the desired position (position at which the area with the width A proceeding from the edge E of the wafer W can be exposed when the means 4 for wafer edge determination described below captures the edge E of the wafer W).

(3) If then a wafer edge determination start signal is sent from the operation part CPU within the controller 50 to the part MD1 for driving the device 3 for moving the means for edge determination, the part MD1 drives the device 3, moves the means 4 for wafer edge determination in the direction to the wafer W, and determination of the position of the edge E of the wafer W is started by the means 4 for wafer edge determination.

(4) The controller 50 rotates the rotary stage 6 by the given amount when it receives from the light receiving part 42 a signal which shows that the edge E of the wafer W has been captured, as was described above. This amount of rotation is greater than the distance D1 (5 mm in FIGS. 14(*a*) to 14*d*), as was described above) between the means 4 for wafer edge determination and the notch determination means 9. As was also described above, the rotary stage 6 is turned by the above described given amount after the wafer edge E has been determined. When the output of the notch determination means 9 has not changed in the meantime, rotation is ended and the exposure sequence is begun. If during rotation of the rotary stage 6 by the above described given amount, the output of the notch determination means 9 has changed, based on its change state, the relative position of the notch N to the means 4 for wafer edge determination is computed, the initial exposure position is determined and exposure is begun. In this way, in the above described states (a) to (c), when exposure starts, exposure following the notch by the means 4 for wafer edge determination is prevented from being carried out unchanged in the state in which the notch is not determined by the notch determination means 9. Therefore, the above described disadvantage is avoided such that the area which is located within the wafer (and which need not be exposed) is still exposed. Control when the above described exposure starts is described below.

When exposure is started, the shutter drive device 15 is driven and the shutter 14 is opened. The peripheral area of the wafer W is irradiated via the exposure light irradiation part 2 with exposure light with the given irradiation area S. The controller 50 furthermore drives almost simultaneously with opening of the shutter 14 the treatment stage rotation device 61 and exposes the peripheral area of the wafer W by its rotating the wafer W with a rotational speed and an angular range each of which is input beforehand into the input part 7. In doing so, the controller 50 controls the device 3 for moving the means for edge determination and moves the means 4 for wafer edge determination to a position at which the means 4 for wafer edge determination outputs to the controller 50 a signal which shows that the edge E of the wafer W is always captured. As was described above, the area S, irradiated with exposure light before exposure, is moved to a position at which the area with a width A proceeding from the edge E of the wafer W can be exposed, when the means 4 for wafer edge determination captures the edge E of the wafer W. Moreover, this irradiation area S, upon exposure, is synchronized with the means 4 for wafer edge determination and moved in the same direction and by the same amount. The peripheral area of the wafer W can therefore be exposed at the exposure width A which is constant.

(5) When exposure of the peripheral area of the wafer W is completed, the controller 50 closes the shutter 14, ends rotation of the treatment stage 6 and furthermore returns the exposure light irradiation part 2 to the initial position.

Control is described below for the case in which the peripheral area of the wafer is exposed by determination of the edge of the wafer which has an outside peripheral area provided with a notch and to which a photoresist has been applied by the device shown in FIGS. 1 to 3 for exposing the peripheral area.

First, control is described in the case in which exposure is started as a prerequisite of the invention and that during exposure the notch is determined using the notch determination means 9. Exposure in this case is identical to the exposure described above using FIGS. 14(*a*) to 14(*d*).

As was described above, the wafer W which has been placed on the treatment stage 6 is turned clockwise by the drive of the treatment stage drive device 61. The means 4 for wafer edge determination determines the edge E of the wafer W at position in FIGS. 14(*a*) to (*d*). The area S which is irradiated with the exposure light which emerges from the exposure light exit part 2 is located on the surface of the wafer W at the point at which the sensor light from the projection part 41 is emitted onto the peripheral area of the wafer W, i.e. essentially at the same location as position. The notch determination means 9 upstream of the wafer W, i.e. at the above described position ◉ as shown in FIGS. 14(*a*) to 14(*d*) determines the edge E of the wafer W.

(1) When the edge area except for the notch of the wafer is determined by the notch determination means (FIG. 14(*a*)):

The controller 50 controls the device 3 for moving the means for edge determination and moves the means 4 for wafer edge determination to the position at which the means 4 outputs to the controller 50 a signal which shows that the edge E of the wafer W is always captured, i.e., at the position at which the means 4 outputs to the controller 50 a certain constant analog signal. The amount of sensor light from the projection part 41 which is projected onto the light receiving part 42 therefore hardly changes. Even if the middle of the wafer W and the center of rotation of the treatment stage 6 do not agree with one another and the wafer W turns eccentrically, a major change does not appear in the signal from the light receiving part 42, because the edge E is a smooth arc.

Since the notch determination means 9 in the vicinity of the means 4 for wafer edge determination is located integrally with the means 4 for wafer edge determination, the amount of sensor light which is input into the light receiving part 92 of the notch determination means 9 has essentially the same value as the amount of light received by the light receiving part 42 of the means 4, if the wafer W is turned eccentrically.

Therefore, the same analog signal is output to the comparison circuit CC1 of the controller 50 as to the light receiving part 42.

Therefore, the value of the above described signal which is input to the comparison circuit CC1 is smaller than the adjustment value I1. The device 3 for moving the means for edge determination therefore exposes the peripheral area by its moving the area S irradiated with the exposure light emitted from the exposure light irradiation part 2.

Here, the adjustment value I1 was intended to reduce the "noise" of the analog signal. It is, for example, a threshold value which has been set to prevent the controller 50 from incorrectly recognizing scratches or the like of the edge E of the wafer as notches N.

(2) When the notch determination means has reached the start of the notch of the wafer (FIG. 14(*b*)):

When the wafer W is turning clockwise and reaches the start Ns of the notch N of the wafer W for the determination position ◉ of the notch determination means 9, the amount of sensor light from the projection part 91 which is projected onto the light receiving part 92 increases acutely because in the area of the notch N the wafer W which has shielded the sensor light has been removed.

As a result, the analog signal which has been output to the comparison circuit CC1 of the controller 50 becomes greater than the adjustment value I1. Therefore an ON signal is output from the comparison circuit CC1 to the operation part CPU.

Based on the above described ON signal, on the rotational speed of the rotary stage 6, and on the distance between the determination position ◉ of the notch determination means 9 and the determination position of the means 4 for wafer edge determination (in this embodiment 5 mm), the operation part CPU computes the time T1 at which the area S which has been irradiated with the exposure light reaches the start Ns of the notch N.

(3) When time T1 after the notch determination means has reached the start of the notch has elapsed (FIG. 14(*c*)):

When time T1 after the notch determination means 9 has reached the start Ns of the notch N elapses, the area S irradiated with the exposure light reaches the start Ns of the notch N. The operation part CPU outputs an operation stop signal to the part MD1 for driving the device for moving the means for edge determination which stops operation of the device 3 for moving the means for edge determination based on this signal.

The operation part CPU computes the time T2 at which operation of the device 3 is to be restarted.

There are various computation methods to compute time T2. For example, based on the gap dimension of the notch N which is determined by the SEMI standard, and based on the rotational speed data of the treatment stage 6 which have been input into the input part 7, the time T2 is determined at which the area S travels from the start Ns of the notch N to the end Ne of the notch N. Furthermore, based on the time up to repeated output of the above described OFF signal after output of the ON signal by the notch determination means 9, the time T2 can be computed in which the area S travels from the start Ns of the notch N to the end Ne of the notch N.

(4) If the time T2 after the area irradiated with the exposure light has reached the start of the notch has elapsed (FIG. 14(*d*)):

When time T2 after the area S reaches the start of the notch N elapses, the area S irradiated with exposure light reaches the end Ne of the notch N. The operation part CPU within the controller 50 outputs to the part MD1 a restart signal for driving the device 3 so that operation of the device 3 for moving the means for edge determination 4 can begin again. Operation of the device 3 is therefore restarted so that the area S irradiated with the exposure light emitted from the exposure light irradiation part 2 can begin again.

As was described above, the exposure control prevents the irradiation area from moving in a V-shape in the notch area of the wafer so the area which is located within the wafer (and which need not be exposed) is prevented from being exposed.

The time T1 until which the area S irradiated with exposure light reaches the start Ns of the notch N was computed. However, since the distance between the notch determination means 9 and the area S is known, based on the notch determination signal, the relative position of the area S relative to the start Ns of the notch at this instant can be determined. Therefore, rather than the above described computation of the time T1, operation of the device 3 for moving the means for edge determination can be stopped after the notch determination means 9 has output the determination signal and after the wafer has been turned by the above described relative distance.

Furthermore, instead of determining the above described time T2, the wafer can be turned by the distance which corresponds to the notch width, and operation of the device 3 for moving the means for edge determination can be restarted after the area S has reached the end Ne of the notch N.

Treatment when exposure is started is described below using embodiments of the invention.

In the invention, the rotary stage 6 is turned by a given amount. This given amount is fixed below at "(D1+α)" when the distance between the means 4 for wafer edge determination and the notch determination means 9 is fixed at (D1), if the edge E of the wafer W is determined when exposure starts.

The position at which exposure was begun is stored, the wafer is turned at least once by exposing the peripheral area of the wafer, and exposure is ended when exposure has been carried out up to the position at which the above described exposure was begun. If during exposure the notch is determined, the notch disregard control described above using FIGS. 14(a) to 14(d) is carried out.

If when the edge E of the wafer W is determined upon starting of exposure, the above described states (a) and (c) are not present, therefore when the wafer edge is determined the notch disregard control described above using FIGS. 14(a) to (d) can be carried out without carrying out special treatment. Thus the area which is located within the wafer (and which need not be exposed) is prevented from being exposed.

Even if, when the wafer edge is determined, the above described states (a) to (c) are present, the following measure can prevent the disadvantage that the area which is located within the wafer is exposed:

After determination of the wafer edge in the above described manner, the rotary stage 6 is turned by the given amount. If the output of the notch determination means 9 has not changed in the meantime, exposure is begun after completion of rotation. If during rotation by the given amount the output of the notch determination means 9 has changed, based on its change state the exposure starting position is determined and thus exposure is begun.

Embodiments of the invention are described below.

(1) Embodiment 1

Figure 4:
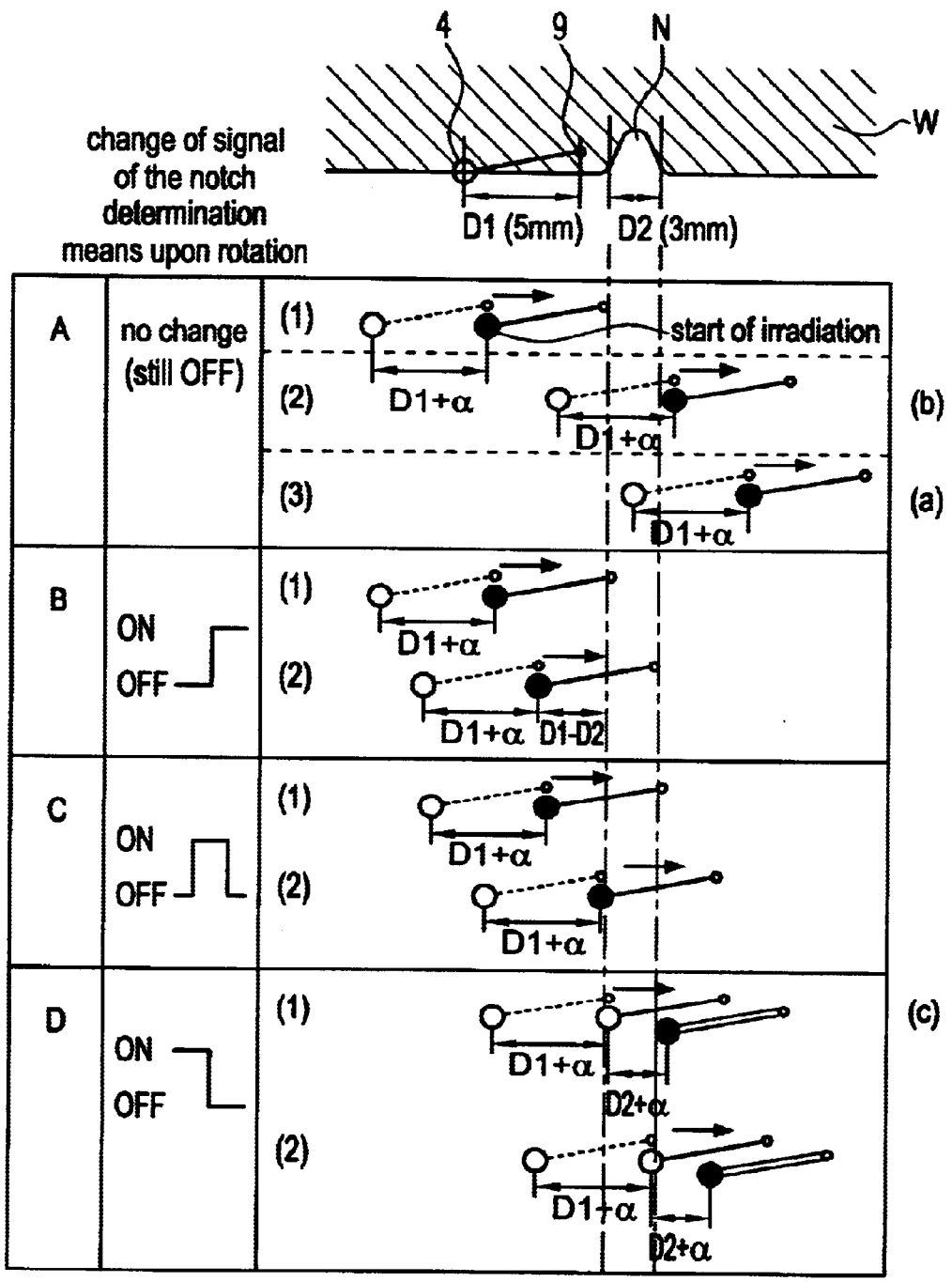
FIG. 4 shows a schematic of a first embodiment of operation in the determination of the wafer edge in the invention.
Figure 5:
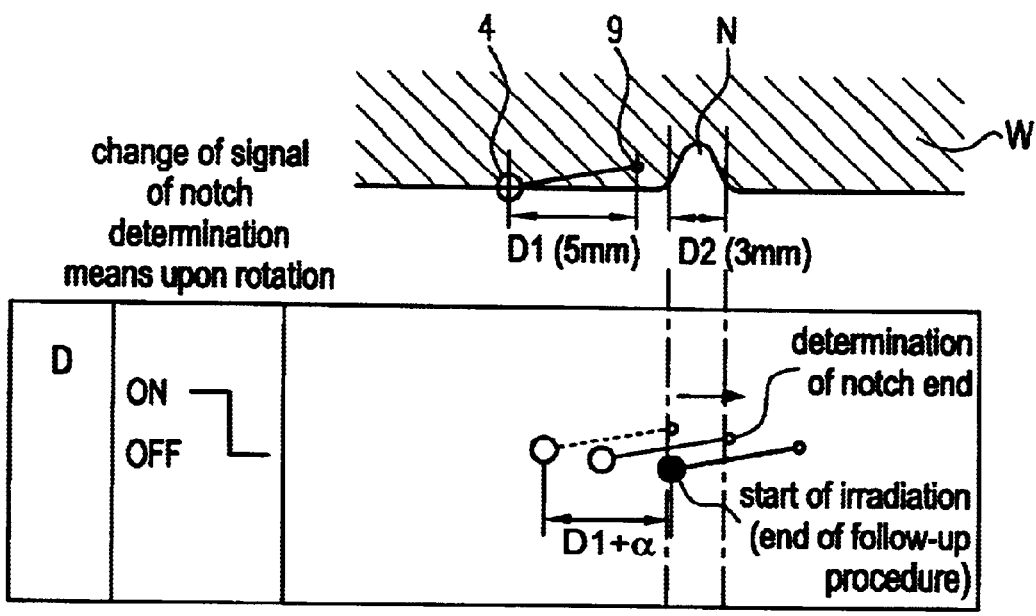
FIG. 5 shows a schematic of one version of the first embodiment.
Figure 6:
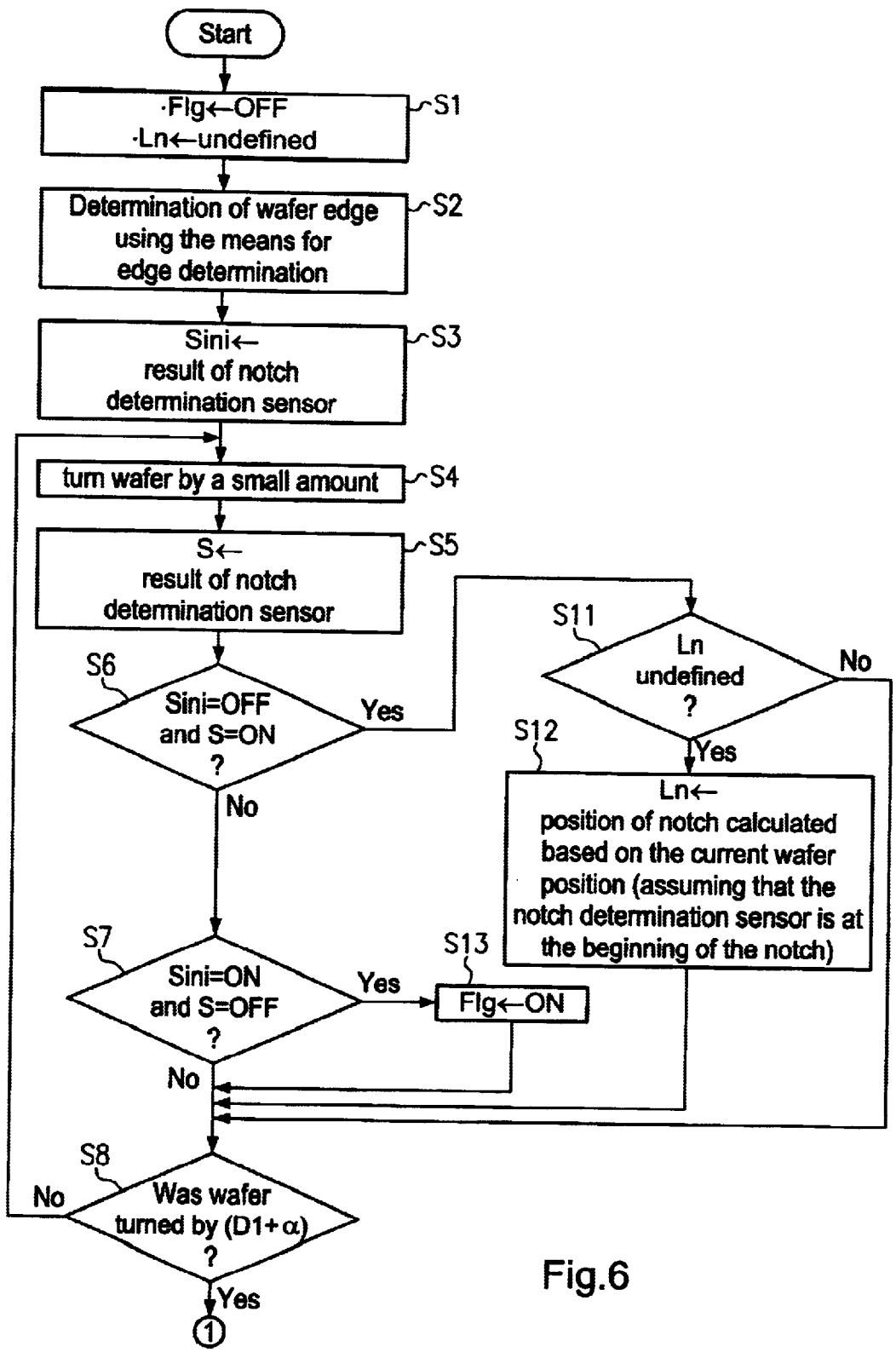
FIG. 6 shows a flow chart (1) which shows treatment in the operation part in the first embodiment.
Figure 7:
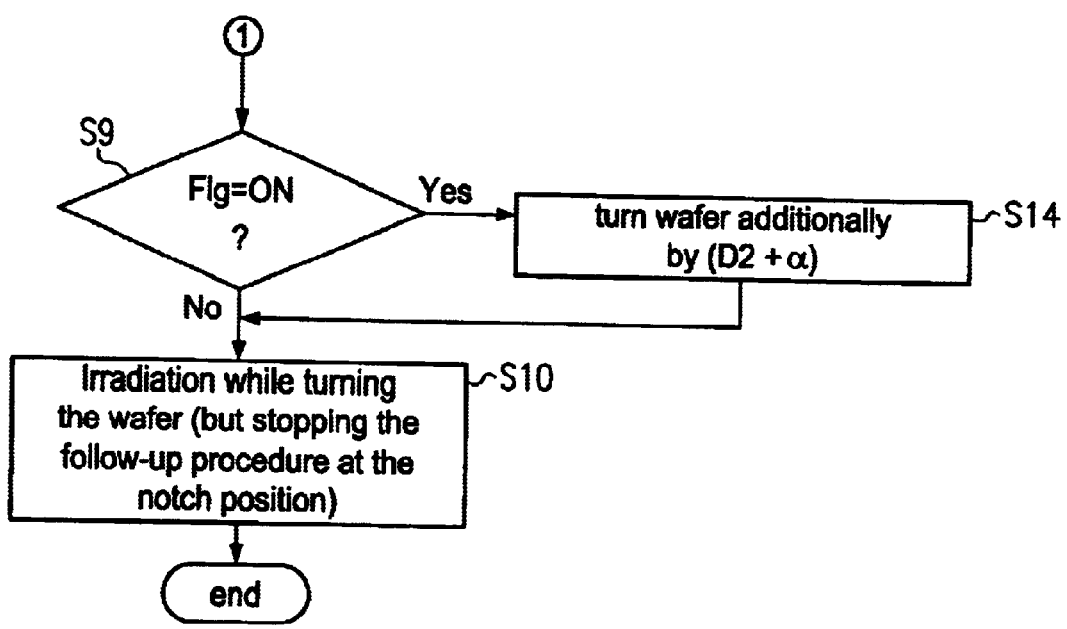
FIG. 7 shows a flow chart (2) which shows treatment in the operation part in the first embodiment.

FIG. 4 is a schematic of the first embodiment of operation in determining the wafer edge of the invention. FIG. 5 is a schematic of one version of the first embodiment. FIG. 6 and FIG. 7 each show in a flow chart the operation the CPU.

FIG. 4 shows the vicinity of the notch enlarged. Areas A to D each show the relative positional relationship of the notch determination means 9, the means 4 for wafer edge determination and the notch N to one another, when the wafer edge is determined and when the rotary stage is turned by the given amount (D1+α). In FIG. 4, the circle provided with reference number 4 labels the means 4 for wafer edge determination and the black circle labels the instant of the start of exposure. Furthermore, the circle provided with a reference number 9 labels the notch determination means 9. The reason why the notch determination means 9 with respect to the wafer is positioned slightly more to the inside than the means 4 for wafer edge determination is to determine with certainty the notch N even if the wafer center is eccentric with respect to the center of rotation. This also applies to the other embodiments. The notch determination means 9 is located upstream of the means 4 for wafer edge determination. In this example, the distance D1 of the means 4 for wafer edge determination is 5 mm. The notch width (notch opening length) is roughly 3 mm.

In FIG. 4, the broken lines as lines between the means 4 for wafer edge determination and the notch determination means 9 show the positions of the notch determination means 9 and of the means 4 for wafer edge determination in the determination of the wafer edge, the bold solid lines show the positions of the notch determination means 9 and of the means 4 for wafer edge determination after rotation of the rotary stage by the above described given amount of (D1+α) after determination of the wafer edge, and the double lines show the positions of the notch determination means 9 and of the means 4 for wafer edge determination when the rotary stage is turned additionally by an amount of (D2+α) after its rotation by the given amount of (D1+α). Furthermore, using movements (1) to (3) in FIG. 4 at A, a state is shown in the situation in which when the edge is determined and the means for wafer edge determination and the notch determination means are located at various positions. The position of the wafer edge determination sensor and the position irradiated with exposure light likewise agree with one another, as was described above using FIGS. 14(a) to 14(d).

A first embodiment of operation in the determination of the wafer edge of the invention in cases A to D is described below using FIG. 4.

(1) If the notch determination means 9 and the means 4 for wafer edge determination in case A are in the states shown using the broken lines when the wafer edge is determined and if during rotation by the given amount (D1+α) the notch determination means 9 remains unchanged in OFF state, then the following three cases as is shown in FIG. 4 at A can be imagined:

(1) A case in which the notch area is not involved at all.

(2) A case in which when the wafer edge is determined the notch is present between notch determination means and the means for wafer edge determination (case of the state described above in situation (b)).

(3) A case in which when the wafer edge is determined the position of the means for wafer edge determination and the position of the notch agree with one another (case of the state described above in (a)).

In the above described case (1) rotation takes place by the given amount and exposure is begun. If after starting of exposure the notch is determined by the notch determination means 9, the notch disregard control described above using FIGS. 14(a) to 14(d) is carried out.

In the above described case (2), after rotation by the given amount, exposure is also begun. Since this given amount of (5 mm+α) of rotation is greater than the notch width D2 (3 mm), as is shown in FIG. 4 at A (2), exposure is begun at a position after the notch. The notch N is therefore determined with essentially one-time rotation of the wafer after starting of exposure by the notch determination means 9. Thus, the notch disregard control described above using FIGS. 14(a) to 14(d) is carried out and in this way the disadvantage of exposing the area which is located within the wafer can be avoided.

The above described case (3) is identical to the above described case (2). After rotation by the given amount, exposure is begun. In this case exposure is also begun at a position after the notch, as is shown in FIG. 4 at A (3).

As was described above, in the case of the state as shown in FIG. 4 at A, in all cases (1), (2), and (3) after rotation by a given amount exposure is begun, having waited for the notch to be determined, and notch disregard control is carried out, as was described above using FIGS. 14(a) to 14(d). In this way, the disadvantage of exposing the area which is located within the wafer (and which need not be exposed) can be avoided.

In the case A, when the wafer is rotated by the given amount, the output of the notch determination means 9 during rotation is not changed. But in the case in which during the above described rotation the output of the notch determination means 9 changes, in items (2) to (4) described below the instant for start of exposure is fixed. This means that in cases B and C of FIG. 4 after rotation by the given amount (D1+α) exposure is begun, as in the above described case A. In the case of a change of the notch determination means in case D from ON to OFF, an addition rotation of D2+α is added and afterwards exposure is begun.

(2) If the notch determination means 9 and the means 4 for wafer edge determination are in the states shown using the broken lines according to FIG. 4 at B when the wafer edge is determined and if during rotation by the given amount (D1+α) the notch determination means 9 is changed from OFF to ON.

In this case, during the above described rotation by the given amount, an ON signal which indicates the notch starting point is output from the notch determination means 9 to the above described controller 50. Based on the above described ON signal the controller 50 determines the starting position of the notch. When the wafer is rotated by the given amount and when the means 4 for wafer edge determination and the notch determination means 9 arrive at the positions according to FIG. 4 at B shown using the bold solid lines, exposure is begun. When the irradiation area reaches the above described notch starting position, the above described notch disregard control (stopping of the tracking motion of the exposure light irradiation part) is carried out.

In this case, exposure is begun from the position directly adjacent to the notch. But if, as was described above, an ON signal is determined, the above described notch disregard control is carried out. Therefore the area which is located within the wafer is prevented from being exposed.

(3) If the notch determination means 9 and the means 4 for wafer edge determination are in the states shown using the broken lines according to FIG. 4 at C when the wafer edge is determined and if during rotation by the given amount of (D1+α) the notch determination means 9 is changed from OFF to ON and from ON to OFF.

In this case, as in the above described case (2), during rotation by the above described given amount an ON signal which indicates the notch starting point is also output from the notch determination means 9 to the controller 50. Based on this ON signal the controller 50 determines the notch starting position. When the wafer is turned by the given amount (D1+α) and when the means 4 for wafer edge determination and the notch determination means 9 arrive at the positions according to FIG. 4 at C, shown using the bold solid lines, exposure is begun. When the above described irradiation area reaches the notch starting position, the above described notch disregard control (stopping of the tracking motion of the exposure light irradiation part) is carried out.

In this case, there are cases in which the exposure starting position is located in the notch area, as is shown in FIG. 4 at B. However, since the tracking motion of the exposure light irradiation part is stopped by the notch disregard control, there is no problem.

(4) If the notch determination means 9 and the means 4 for wafer edge determination are in the states shown using broken lines according to FIG. 4 at D when the wafer edge is determined and if during rotation by the given amount (D1+α) the notch determination means 9 is changed from ON to OFF (case of the above described state (c)).

In this case the notch determination means 9 at the instant of determining the wafer edge is in the ON state. It is therefore known that the notch is present there. But it is not known where the notch starting point is located.

Therefore, as was described above, based on the ON signal of the notch determination means 9, the notch starting position cannot be determined. Therefore, when exposure starts after rotation of the wafer by the given amount, notch disregard control cannot be carried out, even if there is agreement with the notch area, as is shown in FIG. 4 at D.

In this case, therefore, the above described controller 50 begins exposure after the wafer has been additionally rotated by the notch width D2 (3 mm)+α and has been moved as far as the position shown using the double lines as shown in FIG. 4 at D.

In this way exposure is begun at the position after the notch. After starting exposure, the wafer is rotated essentially once. If afterwards, the notch is determined, the notch disregard control shown above using FIGS. 14(a) to 14(d) is carried out.

In the above described item (4), after rotation of (D1+α) additional rotation by (D2+α) takes place. However, as a result of the timing with which the determination signal by the notch determination means 9 changes from ON to OFF, the notch position can be determined and notch disregard control can be carried out.

As is shown in FIG. 5, in the controller 50, based on the rotational speed of the wafer and the notch width D2, the notch starting position is computed when the output of the notch determination means 9 changes from ON to OFF.

When the irradiation area of the notch starting position is reached, as was described above, notch disregard control is carried out and the tracking motion of the exposure light irradiation part is stopped. The controller 50 does begin exposure, after rotation by the given amount of (D1+α) has taken place after determination of the notch of the wafer. However, since at this instant the tracking motion of the exposure light irradiation part is stopped, the area which is located within the wafer is prevented from being exposed.

Treatment in the operation part CPU of the controller 50 in this embodiment is described using the flow charts of FIG. 6 and FIG. 7.

First, as shown in FIG. 6, initialization of the variables is carried out. This means that the flag Flg is set to OFF and the variable Ln which indicates the determined notch position is set to "undefined" (step S1).

Next, the operation of determining the wafer edge by the means for wafer edge determination is begun (step S2). The determination result by the notch determination means at this time is input to a variable Sini which indicates the output of the notch determination means before rotation of the wafer (step S3).

Then the wafer is turned by an extremely small amount (in practice the wafer is rotated without interruption and the output of the notch determination means is regularly input to the operation part CPU. However, here, for purposes of a simpler explanation, it is assumed that the operation of rotation of the wafer by an extremely small amount is repeated and that the output of the notch determination means is input) (step S4).

The output of the notch determination means after rotation is input to the operation part CPU. The determination result by the notch determination means is input to a variable S which indicates the most recent output of the notch determination means (step S5).

Then it is checked whether the above described variable Sini is in the OFF state and whether at the same time the variable S is in the ON state (step S6). When the variable Sini is in the OFF state and if the variable S is in the ON state, there is a transition to state S11. The case in which the variable Sini is in the OFF state and in which the variable S is in the ON state is the case described above using FIG. 4 at B or C.

If the above described variable Sini is in the OFF state and if the variable S is not in the ON state, there is a transition to step S7 and it is checked whether the above described variable Sini is in the ON state and whether the variable S is in the OFF state. If the variable Sini is in the ON state and the variable S is in the OFF state, there is a transition to step S13. The case in which the variable Sini is in the ON state and in which the variable S is in the OFF state is the case described above using FIG. 4 at D.

If, in the step S7, the variable Sini is in the ON state and if the variable S is not in the OFF state it is assessed whether the wafer has been turned by (D1+α) (step 8). If the wafer has not been turned by (D1+α), there is a return to step S4 and the above described treatment is repeated.

When the wafer has been turned by (D1+α), there is a transition to step S9. When the above described variable Sini is in the OFF state and if the variable S is in the ON state (the cases described above using FIG. 4 at B and FIG. 4 at C), it is checked in step S11 whether Ln is undefined. If Ln is already defined, there is a transition to step S8. If Ln is undefined, in step S12 based on the current wafer rotation position (at the instant at which the variable S is in the ON state) the notch position is determined. This means that it is assumed that at this instant the notch determination means is located at the starting position of the notch, and the relative position of the current irradiation area to the notch is determined, which is input to the variable Ln which indicates the determined notch position and there is a transition to step S8.

When the above described variable Sini is in the ON state and if the variable S is in the OFF state (case as shown in FIG. 4 D) the flag Flg is turned on in step S13 and there is a transition to step S8.

When the wafer has been rotated by (D1+α) in step S9, it is checked whether the flag Flg is in the ON state. When the flag Flg is in the ON state, there is the case described above using FIG. 4 at D. Therefore, the wafer is rotated additionally by (D2+α) and there is a transition to step S10.

When the above described treatment is completed, in step S10 exposure begins, and the peripheral area of the wafer is exposed by rotating the wafer.

When the area S which has been irradiated with the exposure light reaches the notch starting position which was determined in the above described step S12, control in which the exposure light irradiation part follows the wafer edge is stopped, and notch disregard control is carried out. If during the exposure which has been carried out afterwards, the notch is determined at the notch starting position, and control in which the exposure light irradiation part follows the wafer edge is stopped and notch disregard control is carried out, as was described above using FIGS. 14(a) to 14(d).

If the control described above using FIG. 5 is carried out, in step S13, based on the rotational position of the wafer and the notch width D2, the notch starting position is computed, and the notch starting position is input to the variable Ln. Notch disregard control can be carried out in step S10 by Ln. In this case a processing step is no longer needed in step S9 and in step S14.

(2) Embodiment 2

Figure 8:
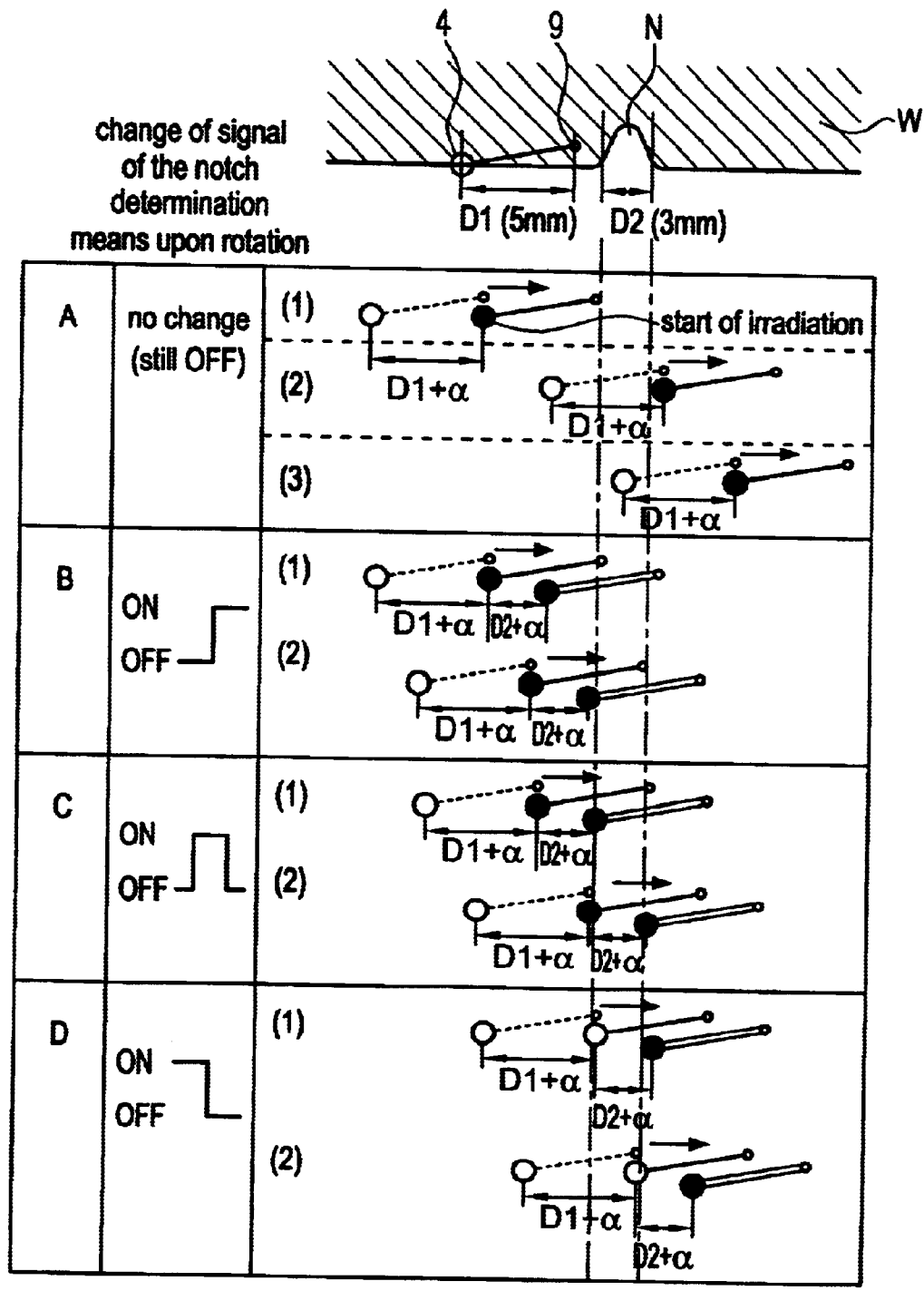
FIG. 8 shows a schematic of a second embodiment of operation in the determination of the wafer edge in the invention.
Figure 9:
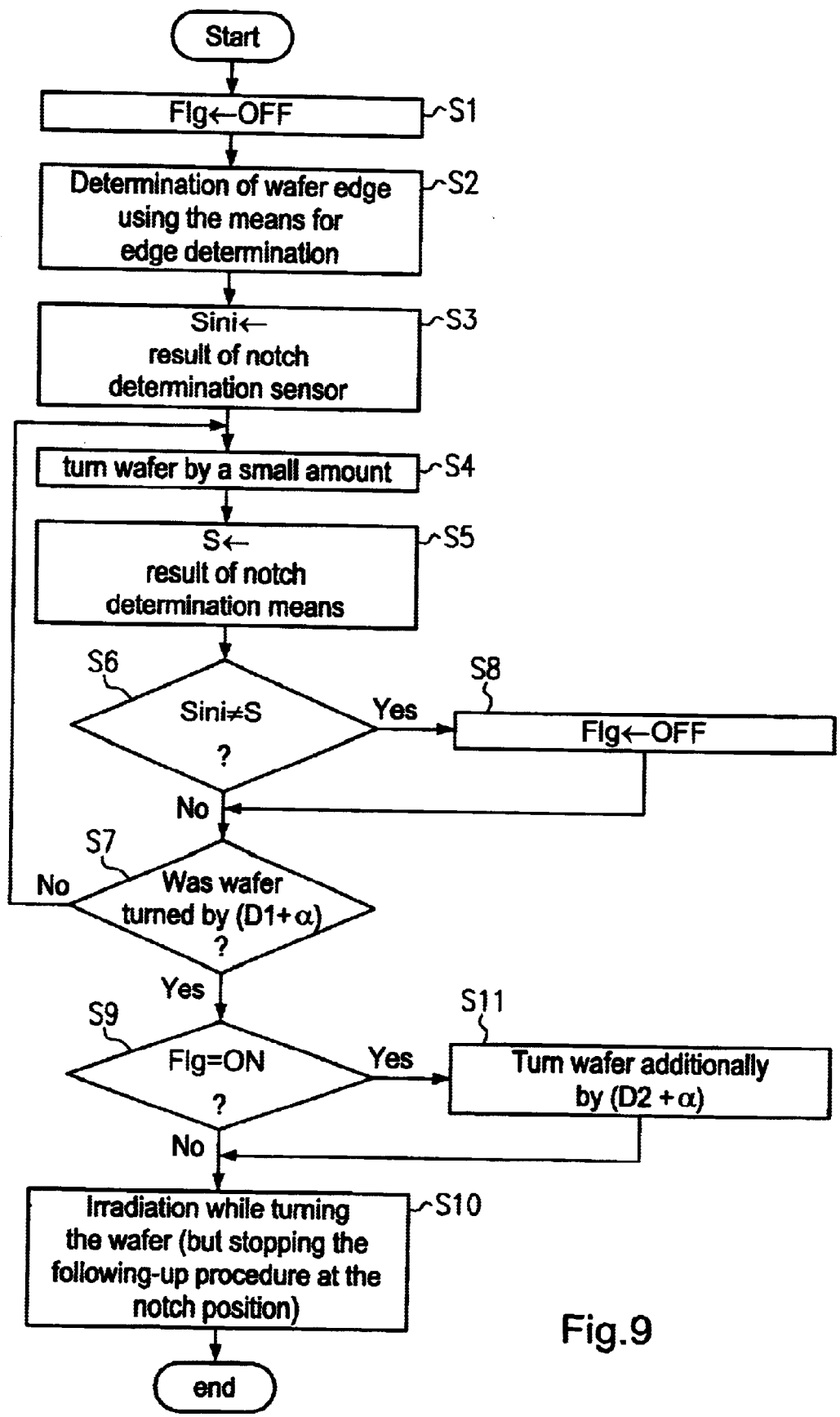
FIG. 9 shows a flow chart which shows treatment in the operation part in the second embodiment.

FIG. 8 is a schematic of the second embodiment of operation in determining the wafer edge of the invention. FIG. 9 shows treatment which is carried out in this embodiment in the above described operation part CPU in one flow chart. In this embodiment, in addition rotation by (D2+α) is added to the cases described above using FIG. 4 at B, C and D (cases in which the notch determination signal changes during rotation by (D1+α)), and afterwards exposure is begun. In the case, shown above using FIG. 4 at A, the wafer is turned by (D1+α) and immediately afterwards exposure is begun.

In this embodiment, only rotation by (D2+α) is added to the above described cases at B, C and D and it is not necessary to carry out various controls according to the change state of the notch determination signal. The control sequence becomes simpler compared to the above described first embodiment. However, since after rotation by the additional distance (D2+α) exposure is begun, the time at which the wafer is turned without exposure becomes longer compared to the first embodiment, in which case the throughput is slightly reduced.

FIG. 8 shows, like FIG. 4, the vicinity of the notch enlarged. In FIG. 8 the circle provided with reference number 4 labels the means 4 for wafer edge determination, the circle provided with reference number 9 labels the notch determination means 9, and the black circle labels the instant of the start of exposure, as in FIG. 4. The notch determination means 9 is located 5 mm upstream of the means 4 for wafer edge determination. The notch width (notch opening length) is roughly 3 mm.

In FIG. 8, the broken lines show the positions of the notch determination means 9 and of the means 4 for wafer edge determination in the determination of the wafer edge, the thick solid lines show the positions of the notch determination means 9 and of the means 4 for wafer edge determination after rotation of the rotary stage by the above described given amount of (D1+α) after determination of the wafer edge, and the double lines show the positions of the notch determination means 9 and of the means 4 for wafer edge determination after rotation of the rotary stage additionally by an amount of (D2+α) after its rotation by the given amount of (D1+α), as was already described using FIG. 4. Furthermore described earlier, using cases (1) to (3) for FIG. 8, the state is shown for each situation when the edge is determined the means for wafer edge determination and notch determination means are located at different positions. The position of the wafer edge determination sensor and the position irradiated with exposure light likewise agree with one another, as was described above using FIGS. 14(a) to (d).

Operation in the determination of the wafer edge in cases A to D is described below using FIG. 8.

(1) If the notch determination means 9 and the means 4 for wafer edge determination are located in the states shown using broken lines in FIG. 8 at A when the wafer edge is determined and if during rotation by the given amount (D1+α) the notch determination means 9 remains unchanged in OFF state.

This case is identical to the case described above using FIG. 4. In the above described case (1), rotation takes place by the given amount and exposure is begun. If, after starting of exposure, the notch is determined by the notch determination means 9, the notch disregard control described above using FIGS. 14(a) to (d) is carried out.

In the above described case at FIG. 8 at A (2), after rotation by the given amount, exposure is also begun. Since this given amount of (5 mm+α) of rotation is greater than the notch width D2 (3 mm), as is shown in FIG. 8 at A (2), exposure is begun at a position after the notch.

The above described case at FIG. 8 at A (3) is identical to the above described case (2). After rotation by the given amount, exposure is begun. In this case exposure is also begun at a position after the notch, as is shown in FIG. 8 at A (3).

If, when the wafer is rotated by the given amount, the output of the notch determination means 9 during rotation is not changed, rotation by (D2+α) is additionally carried out and afterwards exposure is started, as is described above.

(2) If the notch determination means 9 and the means 4 for wafer edge determination are in the states shown using the broken lines according to FIG. 8 at B when the wafer edge is determined and if during rotation by the given amount (D1+α) the notch determination means 9 is changed from OFF to ON.

In this case, during the above described rotation by the given amount an ON signal, which indicates the notch starting point, is output from the notch determination means 9 to the above described controller 50. The above described controller 50 rotates the wafer additionally by the notch width D2 (3 mm)+α, moves it to the positions shown using the bold broken lines according to FIG. 8 at B, and exposure is begun. Furthermore, based on the ON signal of the notch determination means, the controller 50 determines the notch starting position. When the above described irradiation area has reached the notch starting position, the above described notch disregard control (stopping of the tracking motion of the exposure light irradiation part) is carried out.

In this case exposure is begun from the position directly adjacent to the notch. But notch disregard control is carried out, as was described above. Therefore the area which is located within the wafer is prevented from being exposed.

(3) If the notch determination means 9 and the means 4 for wafer edge determination are in the states shown using broken lines according to FIG. 8 at C when the wafer edge is determined and if during rotation by the given amount (D1+α) the notch determination means 9 is changed from OFF to ON and from ON to OFF.

In this case, as in the above described item (2), during rotation by the above described given amount an ON signal, which indicates the notch starting point, is output from the notch determination means 9 to the controller 50. The above described controller 50 rotates the wafer additionally by the notch width D2 (3 mm)+α, thus moving it to the position according to FIG. 8 at C shown using the bold broken lines, and afterwards begins exposure. Furthermore, based on the ON signal of the notch determination means the controller 50 determines the notch starting position, as in the above described item (2). When the above described irradiation area has reached the notch starting position, the above described notch disregard control (stopping of the tracking motion of the exposure light irradiation part) is carried out.

In case (2) in FIG. 8 at C, after rotation by the given amount of (D1+α) there is additional rotation by (D2+α). In this way, the area S which has been irradiated with the exposure light (the means for wafer edge determination) exceeds the notch position. Therefore no notch disregard control is carried out here. After essentially a one-time rotation of the wafer, the notch disregard control described above using FIGS. 14(a) to (d) is carried out.

(4) If the notch determination means 9 and the means 4 for wafer edge determination are in the states shown using broken lines according to FIG. 8 at D when the wafer edge is determined and if during rotation by the given amount (D1+α) the notch determination means 9 is changed from ON to OFF (in the case of the above described state (c)).

In this case, during the above described rotation by the given amount an OFF signal which indicates the notch end point is output from the notch determination means 9 to the controller 50. The above described controller 50 therefore rotates the wafer additionally by the notch width of D2+α, moving it to the position according to FIG. 8 at D shown using the bold broken lines, and afterwards begins exposure.

After rotation of the wafer by (D1+α) in the above described manner, the wafer is additionally rotated by (D2+α), and exposure is begun afterwards. By this measure, as described above using FIG. 4, the exposure starting position exceeds the notch, as shown in FIG. 8. Exposure is therefore begun at a position after the notch. Furthermore, the wafer is turned essentially once after exposure starts, and if afterwards the notch is determined, the notch disregard control described above using FIGS. 14(a) to (d) is carried out.

Treatment in the operation part CPU of the controller 50 in this embodiment is described below using the flow chart of FIG. 9.

First, as shown in FIG. 9, the flag Flg is set to OFF (step S1).

Next, the operation of determining the wafer edge by the means for wafer edge determination is begun (step S2). The determination result by the notch determination means at this time is input to a variable Sini which indicates the output of the notch determination means before rotation of the wafer (step S3).

Then the wafer is turned by an extremely small amount, as was described above (step S4).

The output of the notch determination means after rotation is input to the operation part CPU. The determination result by the notch determination means is input to a variable S which indicates the most recent output of the notch determination means (step S5).

Then, it is checked whether the above described variable Sini is the variable S (step S6). If Sini is not unequal to S, it is assessed whether the wafer has turned by (D1+α) (step S7). If the wafer has not turned by (D1+α), there is a return to step S4 and the above described treatment is repeated. If Sini is not equal to S in the step 8, the above described flag Flg is set to the ON state. This situation is the case described above using FIG. 8 at B, C or D.

When the wafer is turned by (D1+α) in step S9, it is checked whether the flag Flg is in the ON state. If the flag Flg is not in the ON state, there is a transition to step S10. This situation is the case described above using FIG. 8 at A. When the flag Flg is in the ON state, in the step S11 the wafer is rotated by (D2+α) and there is a transition to step S10.

When the above described treatment is completed, in step S10 exposure begins, and the peripheral area of the wafer is exposed by turning the wafer.

If afterwards, as was described above, the notch is determined at the notch starting position, the control in which the exposure light irradiation part follows the wafer edge is stopped and notch disregard control is carried out.

As was described above, in this embodiment in the cases as shown in FIG. 8 at B, C, and D, rotation by (D2+α) is added. In this way, it is not necessary to carry out different controls according to the change state of the notch determination signal. Therefore, treatment in controller 50 can be greatly simplified, as was shown in FIG. 9.

(3) Embodiment 3

Figure 10:
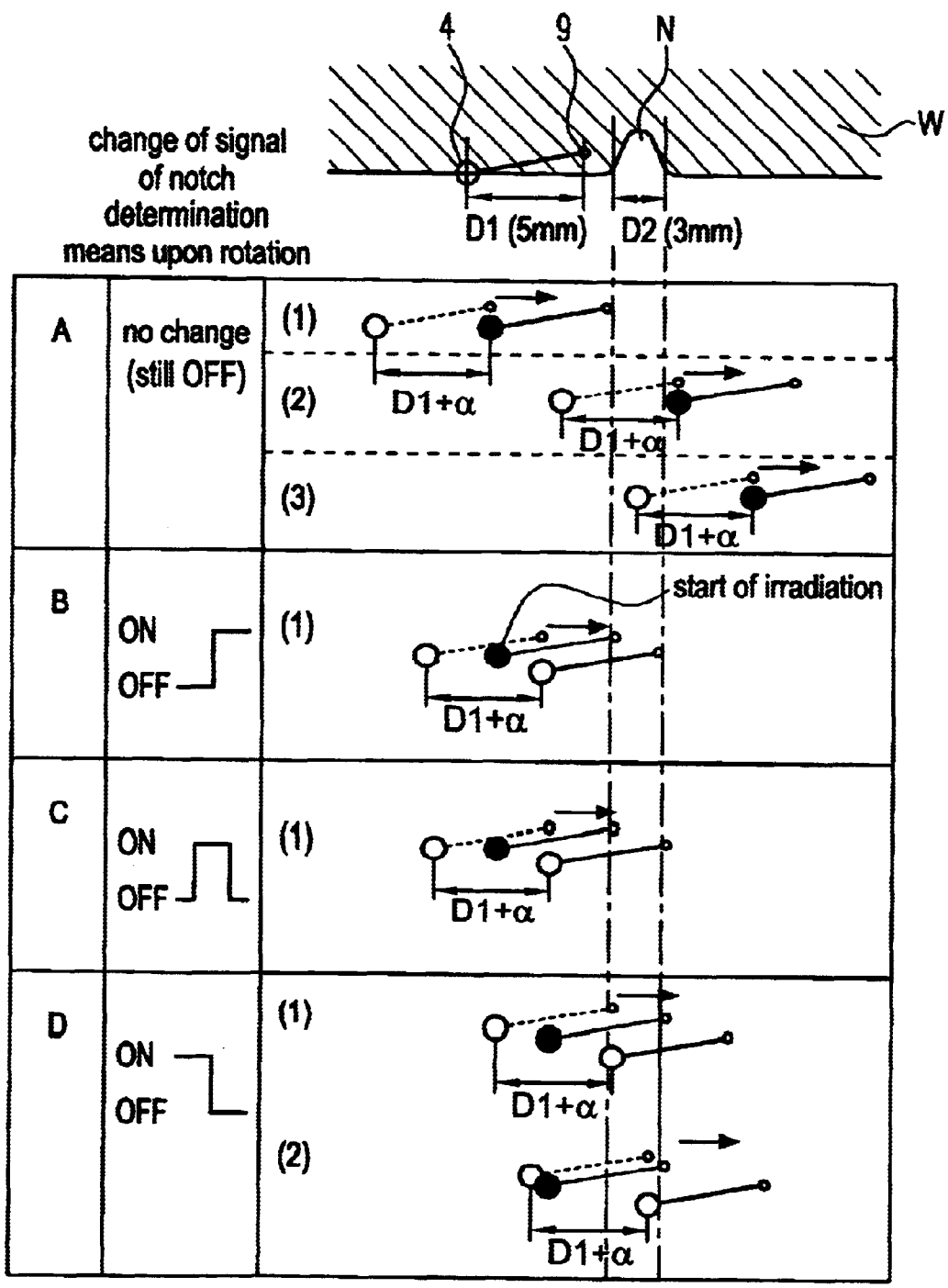
FIG. 10 shows a schematic of a third embodiment of operation in the determination of the wafer edge in the invention.
Figure 11:
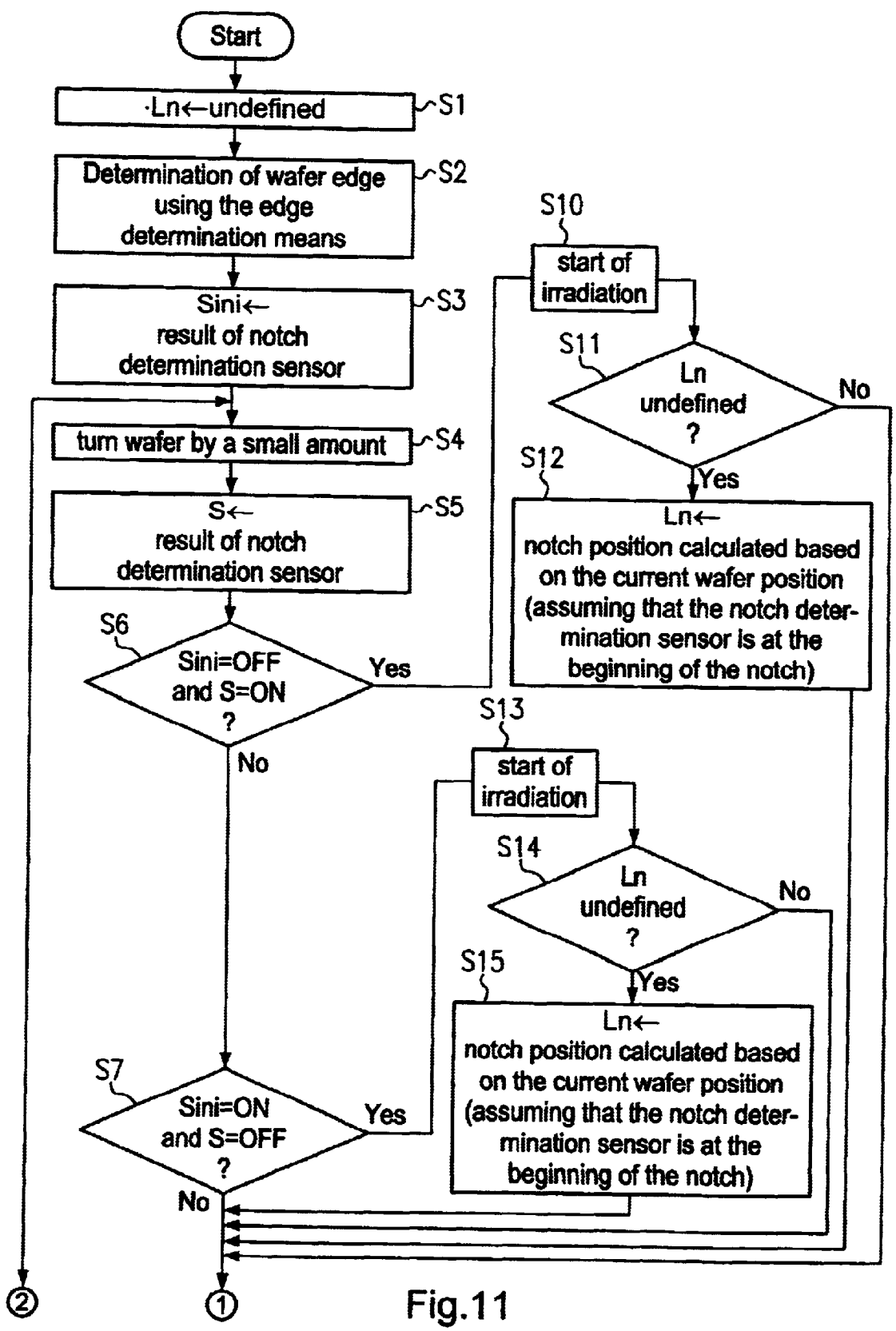
FIG. 11 shows a flow chart (1) which shows treatment in the operation part in the third embodiment.
Figure 12:
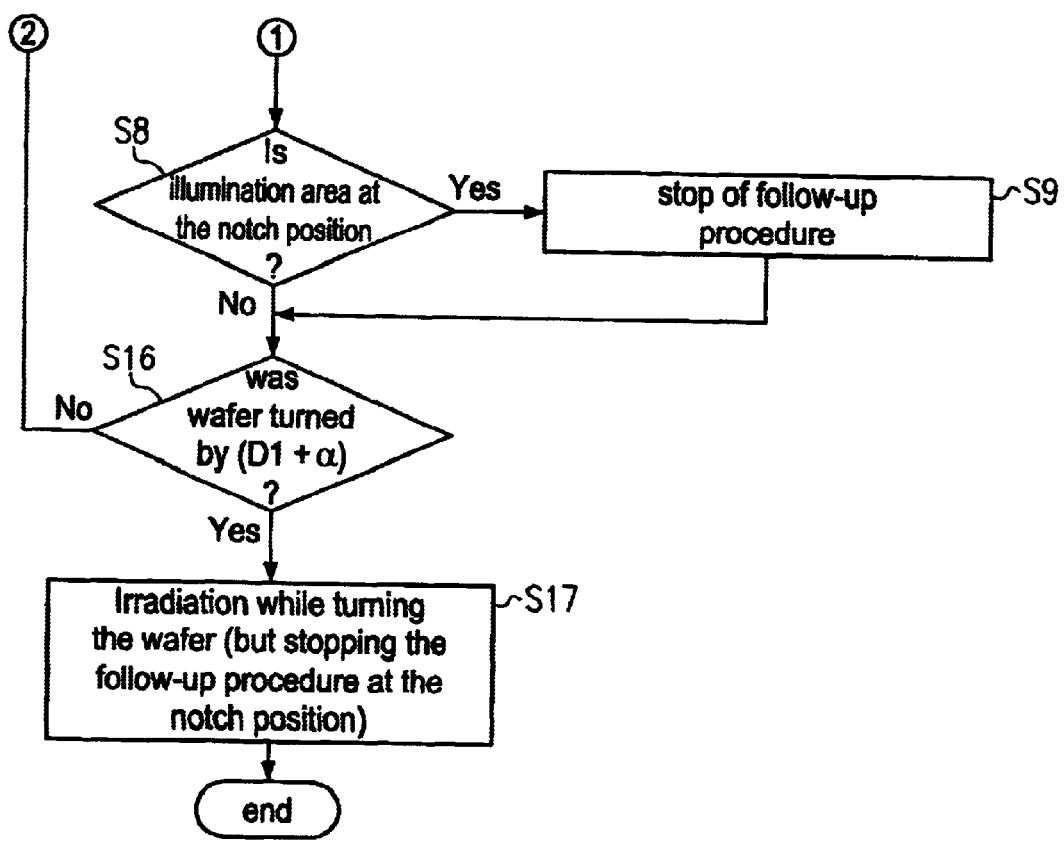
FIG. 12 shows a flow chart (2) which shows treatment in the operation part in the third embodiment.
Figure 13A:
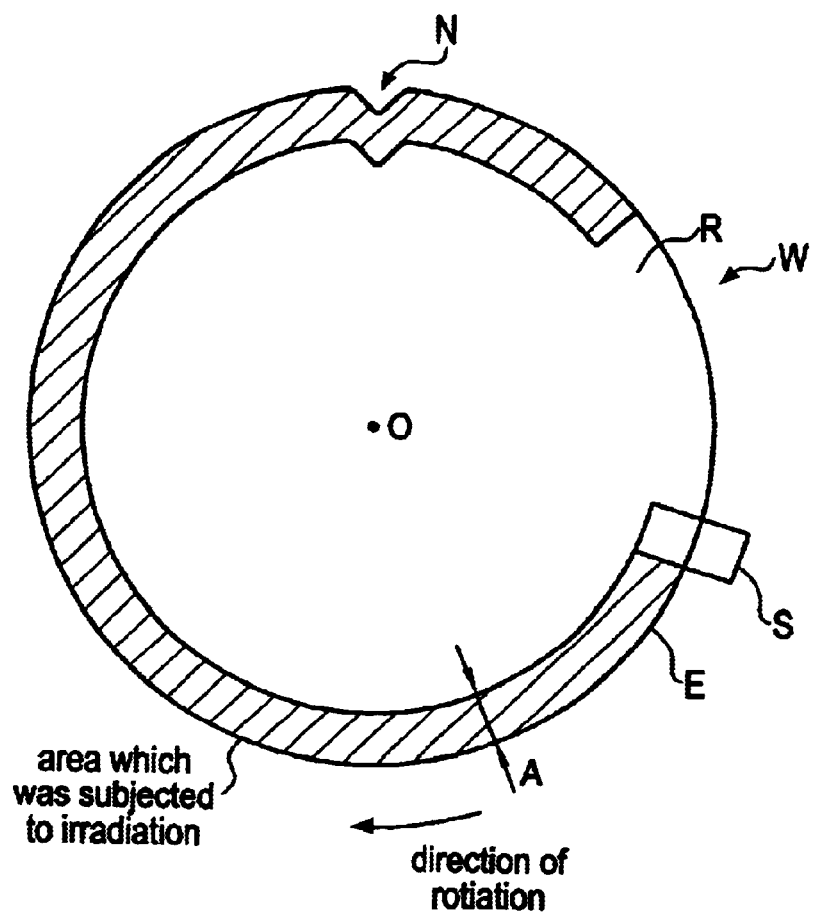
FIGS. 13 (a) and (b) each show a schematic which shows the state in which the peripheral wafer area is exposed by a conventional device for exposure of a peripheral area.
Figure 13B:
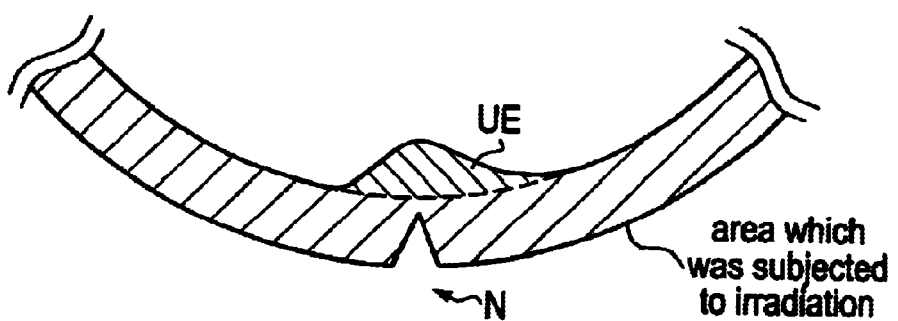
Figure 14A:
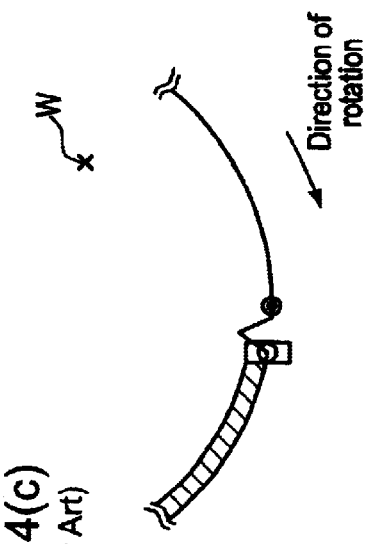
FIGS. 14 (a)–(d) each show a schematic which shows the state in which the peripheral wafer area is exposed by a conventional device for exposure of a peripheral area, in which in the notch area the area which is located within the wafer and which need not be exposed is also prevented from being exposed.
Figure 14C:
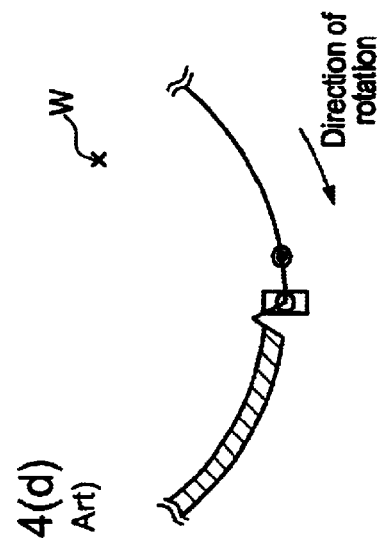
Figure 14B:
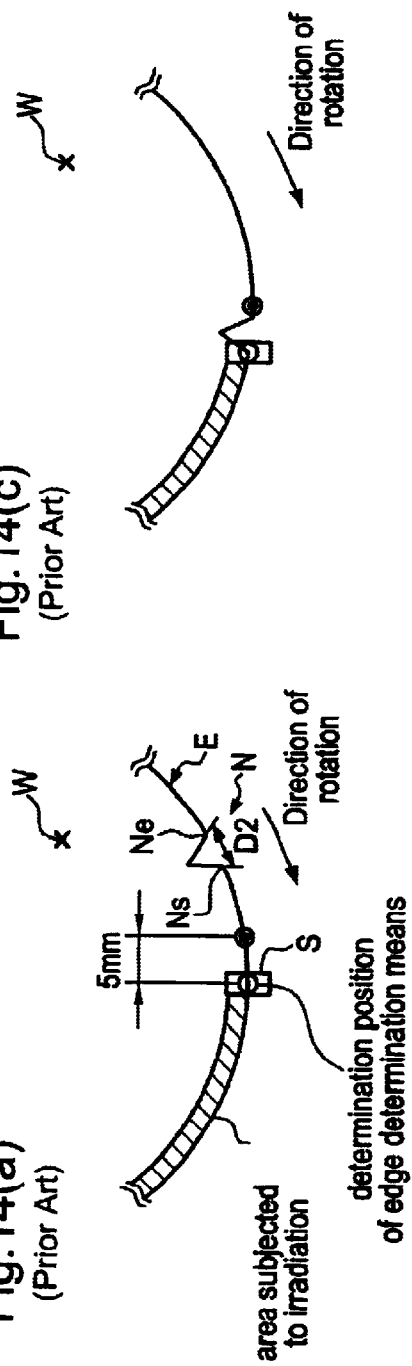
Figure 14D:
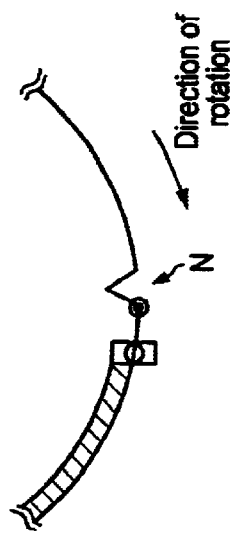

FIG. 10 is a schematic of the third embodiment of operation in determining the wafer edge of the invention. FIG. 11 and FIG. 12 show a flow chart which is carried out in this embodiment in the above described operation part CPU. In this embodiment, when the notch determination signal is output, in the cases described above using FIG. 4 at B, C, and D, exposure is immediately begun without waiting for rotation of the wafer by (D1+α). Thus, the time in which the wafer is rotated without exposure is shortened and the throughput increased.

FIG. 10 shows, like FIG. 4 and FIG. 8, the vicinity of the notch enlarged. In FIG. 10 the circle provided with reference number 4 labels the means 4 for wafer edge determination, the circle provided with reference number 9 labels the notch determination means 9, and the black circle labels the exposure starting position, as shown in FIG. 4 and FIG. 8. The notch determination means 9 is located 5 mm upstream of the means 4 for wafer edge determination. The notch width (notch opening length) is roughly 3 mm.

In FIG. 10, the broken lines show the positions of the notch determination means 9 and of the means 4 for wafer edge determination in the determination of the wafer edge, the bold solid lines show the positions of the notch determination means 9 and of the means 4 for wafer edge determination after rotation of the rotary stage by the above described given amount of (D1+α) after determination of the wafer edge, and the solid black circles show the positions of the notch determination means 9 and of the means 4 for wafer edge determination when exposure starts, as was described above. Furthermore, using (1) to (3) in FIG. 10, the state is shown for each in the case in which, when the edge is determined, the means for wafer edge determination and the notch determination means are located at different positions. The position of the wafer edge determination sensor and the position irradiated with exposure light likewise agree with one another, as was described above using FIGS. 14(a) to (d).

Operation in the determination of the wafer edge in cases A to D is described below using FIG. 10.

(1) If the notch determination means 9 and the means 4 for wafer edge determination are in the states shown using broken lines in FIG. 10 at A when the wafer edge is determined, and, if during rotation by the given amount (D1+α), the notch determination means 9 remains unchanged in OFF state.

This case is identical to the case described above using FIG. 4 and FIG. 8. In the above described case (1) rotation takes place by the given amount and exposure is begun. If, after starting of exposure, the notch is determined by the notch determination means 9, the notch disregard control described above using FIGS. 14(a) to (d) is carried out.

In the above described case in FIG. 10 at A (2), after rotation by the given amount, exposure is also begun. Since this given amount of (5 mm+α) of rotation is greater than the notch width D2 (3 mm), as is shown in FIG. 10 at A (2), exposure is begun at a position after the notch.

The above described case at FIG. 10 at A (3) is identical to the above described case (2). After rotation by the given amount, exposure is begun. In this case exposure is also begun at a position after the notch, as is shown in FIG. 10 at A (3).

If, when the wafer is rotated by the given amount, the output of the notch determination means 9 during rotation changes, by the timing with which the notch determination signal has changed the notch starting position can be detected. Therefore, exposure begins immediately, as was described above, and the above described notch disregard control is carried out when the exposure light irradiation part (means for wafer edge determination) reaches the notch starting position.

(2) If the notch determination means 9 and the means 4 for wafer edge determination are in the states shown using the broken lines according to FIG. 10 at B when the wafer edge is determined and if during rotation by the given amount (D1+α) the notch determination means 9 is changed from OFF to ON.

In this case, during the above described rotation by the given amount an ON signal which indicates the notch starting point is output from the notch determination means 9 to the above described controller 50. Furthermore, based on the ON signal of the notch determination means the above described controller 50 determines the notch starting position and immediately begins exposure. When the irradiation area has reached the notch starting position, the above described notch disregard control (stopping of the tracking motion of the exposure light irradiation part) is carried out.

In this case exposure is begun immediately when the ON signal of the notch determination means is output. However, since notch disregard control is carried out in the above described manner, the area which is located within the wafer is prevented from being exposed.

(3) If the notch determination means 9 and the means 4 for wafer edge determination are in the states shown using the broken lines according to FIG. 10 at C when the wafer edge is determined and if during rotation by the given amount of (D1+α) the notch determination means 9 is changed from OFF to ON and from ON to OFF.

In this case, as in the above described item (2), during rotation by the above described given amount an ON signal which indicates the notch starting point is output from the notch determination means 9 to the controller 50. Based on the ON signal of the notch determination means, the above described controller 50 determines the notch starting position and moreover immediately begins exposure. When the irradiation area has reached the notch starting position, the above described notch disregard control (stopping of the tracking motion of the exposure light irradiation part) is carried out.

(4) If the notch determination means 9 and the means 4 for wafer edge determination are in the states shown using broken lines according to FIG. 10 at D when the wafer edge is determined and if during rotation by the given amount of (D1+α) the notch determination means 9 is changed from ON to OFF (in the case of the previously described state (c)).

In this case, during the above described rotation by the given amount, an OFF signal which indicates the notch end point is output from the notch determination means 9 to the controller 50. The above described controller 50 therefore immediately begins exposure at the instant at which the above described OFF signal was input. Furthermore, at the same time, based on the timing with which the output of the notch determination means 9 has been changed from ON to OFF, based on the rotational speed of the wafer and based on the notch width D2, the notch starting position is computed, as was described above using FIG. 5. When the area S has reached the notch starting position, the notch disregard control (stopping of the tracking motion of the exposure light irradiation part) is carried out, as was previously described above.

Treatment in the operation part CPU of the controller 50 in this embodiment is described below using FIG. 11 and FIG. 12.

First, as shown in FIG. 11, the variable Ln which indicates the determined notch position is set to "undefined" (step S1).

Next, the operation of determining the wafer edge by the means for wafer edge determination is begun (step S2). The determination result by the notch determination means at this time is input to a variable Sini which indicates the output of the notch determination means before rotation of the wafer (step S3).

Then, the wafer is turned by an extremely small amount, as was described above (step S4).

The output of the notch determination means after rotation is input to the operation part CPU. The determination result by the notch determination means is input to a variable S which indicates the most recent output of the notch determination means (step S5).

Then it is checked whether the above described variable Sini is in the OFF state and whether moreover the variable S is in the ON state (step S6). If Sini is in the OFF state and if moreover the variable S is in the ON state, in step S10 exposure is immediately started, and there is a transition to state S11. The case in which the variable Sini is in the OFF state and in which moreover the variable S is in the ON state is the case described above using FIG. 10 at B or C.

If the above described variable Sini is in the OFF state and if the variable S is not in the ON state, there is a transition to step 7 and it is checked whether the above described variable Sini is in the ON state and whether the variable S is in the OFF state. If the variable Sini is in the ON state and the variable S is in the OFF state, then in step S13 exposure is immediately started, and there is a transition to state S14. The case in which the variable Sini is in the ON state and the variable S is in the OFF state is the case described above using FIG. 4 at D.

It is checked in step S11 whether Ln is undefined. If Ln is already defined, there is a transition to step S8. If Ln is undefined, in step S12 based on the current wafer rotation position (at the instant at which the variable S has been changed into the ON state) the notch position is determined. This means that it is assumed that at this instant the notch determination means is located at the starting position of the notch, and the relative position of the current irradiation area S to the notch is determined, it is input to the variable Ln which indicates the determined notch position and there is a transition to step S8.

It is checked in step S14 whether Ln is undefined. If Ln is already defined, there is a transition to step S8. If Ln is undefined, then in step S14 based on the current wafer rotation position (at the instant at which the variable S has been changed into the OFF state) the notch position is determined. This means that it is assumed that at this instant the notch determination means is located at the end position of the notch, and the relative position of the current irradiation area S to the notch is determined, and it is input to the variable Ln which indicates the determined notch position and there is a transition to step S8.

If in step S7 the variable Sini is in the ON state and the variable S is not in the OFF state, there is a transition to step S8 and it is assessed based on the value of Ln whether the irradiation area is located at the notch position. If it is located at the notch position, tracking control is stopped (step S9). It is assessed whether the wafer has been turned by (D1+α) (step S16). If the wafer has not been turned by (D1+α), there is a return to step S4 and the above described treatment is repeated. When the wafer has been turned by (D1+α) there is a transition to step S17.

When the wafer is turned by (D1+α), then in step S17 exposure is begun if exposure has not yet begun. The peripheral area of the wafer is exposed by turning the wafer. If the area S which has been irradiated with the exposure light reaches the notch starting position, the control in which the exposure light irradiation part follows the wafer edge is stopped and notch disregard control is carried out. If during the exposure which is carried out afterwards the notch is determined, as was described above, the control in which the exposure light irradiation part follows the wafer edge is stopped at the notch position and notch disregard control is carried out, as described above using FIGS. 14(a) to (d).

It was described above that the analog signal from the light receiving part 92 of the means 9 for wafer edge determination is amplified by the amplifier AC2 within the controller 50 and is compared to the adjustment value I1 which has been preset in the comparison circuit CC1. If AC2 is larger than the adjustment value I1, the ON signal is output to the operation part CPU. However, the invention is not limited to this variation, and instead a differential circuit can be placed between the amplifier circuit AC2 and the comparison circuit CC1, the differential data compared to the adjustment value which has been preset in the comparison circuit CC1 and an ON signal can be output to the operation part CPU when they are larger than the adjustment value.

In the above described device for exposing a peripheral area the exposure light irradiation part and the means for wafer edge determination are located integrally with one another. The movement of the area which has been irradiated with the exposure light which is emitted from the exposure light irradiation part is carried out by the motion of the exposure light irradiation part by the device for moving the means for wafer edge determination. However, the invention is not limited to this variation, and can also include an individual device for moving the irradiation area and an individual device for moving the means for edge determination, such that the irradiation area can be moved in the same direction as the direction of motion of the above described means for wafer edge determination and by the same amount as the amount of movement thereof.

As was described above, the following is carried out in operation of the invention:

When exposure of the peripheral area of the wafer starts, when determining the wafer edge the wafer is rotated at least by the distance between the means for wafer edge determination and the notch determination means, and afterwards irradiation with the wafer exposure light is begun.

When during the above described rotation, the output signal of the above described notch determination means changes, according to the change state of this output signal proceeding from a preset exposure starting position irradiation with the wafer exposure light is begun, and as a result of the change state of the output signal of the above described notch determination means the position at which the notch starts is determined.

When the above described irradiation area reaches the notch start, the operation of above described device for movement of the area which has been irradiated with exposure light is stopped.

When the above described irradiation area reaches the notch end, the operation of above described device for movement of the area which has been irradiated with exposure light is restarted.

When during the above described rotation the output signal of the above described notch determination means does not change, after completion of the above described rotation, irradiation with exposure light is begun.

When a signal which indicates the notch start is received by the above described notch determination means, based on the above described signal which indicates the notch start the position at which the notch starts is determined.

When the above described irradiation area reaches the notch start, operation of above described device for movement of the area which has been irradiated with exposure light is stopped.

When the above described irradiation area reaches the notch end, operation of above described device for movement of the area which has been irradiated with exposure light is restarted.

This measure makes it possible to carry out notch disregard control, regardless of where the notch is located when the exposure of the peripheral area starts. Therefore, the disadvantage of exposure of the area which is located within the wafer (and which need not be exposed) can be avoided.

What is claimed is:

1. Device for exposing by irradiation a peripheral area of a wafer having a notch in the peripheral area and a photoresist to be irradiated on a surface of the wafer in the peripheral area, comprising:

a means for rotating the wafer;

a means for irradiating the peripheral area of the wafer with exposure light;

a means for moving the irradiated peripheral area;

a means for wafer edge determination by detection of sensor light;

a means for moving the means for wafer edge determination in a back and forth direction from a central position of the wafer to a peripheral edge of the wafer;

a means for determining the location of the notch in the peripheral edge of the wafer located upstream of the means for wafer edge determination and formed integrally with the means for wafer edge determination; and a controller for detecting sensor light and adapted to control the means for moving the means for edge determination such that the amount of sensor light becomes constant, and which is adapted to control the means for moving the irradiation area such that the irradiation area is moved in the same direction as the direction of motion of the means for wafer edge determination and by the same amount as the amount of motion thereof, wherein the controller is adapted to perform the following steps:

prior to exposure of the peripheral area of the wafer and after determining the wafer edge, the wafer is rotated such that the peripheral area of the wafer to be irradiated is moved at least by a distance equal to a distance between the means for wafer edge determination and the means for determining the location of the notch, if, during the rotation of the wafer, an output signal from the means for determining the location of the notch changes from a preset starting signal, irradiation with the exposure light begins, and the position at which the notch starts is determined;

when, after the notch start is determined, the peripheral irradiated area reaches the notch start, operation of the means for movement of the peripheral irradiated area is stopped;

when, after the notch start is determined, an output signal from the means for determining the location of the notch again changes, the position at which the notch ends is determined and when the peripheral irradiation area reaches the notch end, operation of the means for movement of the peripheral irradiated area is restarted;

when, during rotation of the wafer, the output signal from the means for determining the location of the notch does not change, irradiation with exposure light begins after completion of the rotation; and if, prior to the rotation of the wafer, a signal from the means for determining the location of the notch indicates a notch start is present then the position at which the notch starts is determined.

2. The device as set forth in claim 1, wherein the means for wafer edge determination includes a projection part for projecting sensor light and a light receiving part for receiving the projected sensor light.

3. The device as set forth in claim 1, wherein, when the wafer is rotated, the movement of the peripheral irradiation area includes a further distance which is at least equal to the distance from the start to the end of the notch.

4. The device as set forth in claim 1, wherein the means for wafer edge determination and the means for determining the location of the notch are an integral unit.

5. The device as set forth in claim 1, wherein the means for determining the location of a notch is positioned relative to the means for wafer edge determination such that the means for determining the location of the notch is located closer to the center of the wafer than the means for wafer edge determination.

6. Process for exposing by irradiation a peripheral area of a wafer having a notch in the peripheral area of the wafer and a photoresist to be irradiated on a surface of the wafer in the peripheral area using a device comprising:

a means for rotating the wafer;

a means for irradiating the peripheral area of the wafer with exposure light;

a means for moving the irradiated peripheral area;

a means for wafer edge determination by detection of sensor light;

a means for moving the means for wafer edge determination in a back and forth direction from a central position of the wafer to a peripheral edge of the wafer;

a means for determining the location of the notch in the peripheral edge of the wafer, means for determining the location of the notch being located upstream of the means for wafer edge determination and being formed integrally with the means for wafer edge determination; and wherein the process comprises using a controller for detecting sensor light and to control the means for moving the wafer edge determination means such that an amount of light from a sensor becomes constant, and to control the means for moving the irradiation area such that the irradiation area is moved in the same direction as the direction of motion of the wafer edge determination means and by the same amount as the amount of motion thereof, to perform the following steps:

prior to exposure of the peripheral area of the wafer and after determining the wafer edge, the wafer is rotated such that the peripheral area of the wafer to be irradiated is moved at least by a distance equal to a distance between the means for wafer edge determination and the means for determining the location of the notch in the wafer, if, during the rotation of the wafer, an output signal from the means for determining the location of the notch changes from a preset starting signal, irradiation with the exposure light begins, and the position at which the notch starts is determined;

when, after the notch start is determined, the peripheral irradiated area reaches the notch start, operation of the means for movement of the peripheral irradiated area is stopped;

when, after the notch start is determined, an output signal from the means for determining the location of the notch again changes, the position at which the notch ends is determined, and when the peripheral irradiation area reaches the notch end, operation of the means for movement of the peripheral irradiated area is restarted;

when, during rotation of the wafer, the output signal from the means for determining the location of the notch does not change, irradiation with exposure light begins after completion of the rotation; and if, prior to the rotation of the wafer, a signal from the means for determining the location of the notch indicates a notch start is present, then the position at which the notch starts is determined.

7. The process as set forth in claim 6, wherein, when the wafer is rotated, the movement of the peripheral irradiation area includes a further distance which is at least equal to the distance from the start to the end of the notch.

* * * * *